US012716927B2

(12) United States Patent
Majidi-Ahy et al.

(10) Patent No.: US 12,716,927 B2
(45) Date of Patent: Aug. 25, 2026

(54) QUANTUM SPECTRUM SENSING NETWORKS

(71) Applicant: WaveRyde Instruments Inc., Waterloo (CA)

(72) Inventors: Reza Majidi-Ahy, Los Altos Hills, CA (US); Chang Liu, Waterloo (CA); Stephanie M. Bohaichuk, Waterloo (CA); James P. Shaffer, Waterloo (CA)

(73) Assignee: WaveRyde Instruments Inc., Waterloo (CA)

( * ) Notice: Subject to any disclaimer, the term of this patent is extended or adjusted under 35 U.S.C. 154(b) by 0 days.

(21) Appl. No.: 18/919,962

(22) Filed: Oct. 18, 2024

(65) Prior Publication Data

US 2026/0110721 A1 Apr. 23, 2026

Related U.S. Application Data

(60) Provisional application No. 63/655,490, filed on Jun. 3, 2024.

(51) Int. Cl.

| | |
|---|---|
| ***G01R 29/08*** | (2006.01) |
| ***G01N 21/31*** | (2006.01) |
| ***H04B 10/70*** | (2013.01) |

(52) U.S. Cl.

CPC ..... *G01R 29/0885* (2013.01); *G01N 21/3103* (2013.01); *G01R 29/0892* (2013.01); *H04B 10/70* (2013.01)

(58) Field of Classification Search

CPC ................ G01N 22/00; G01N 24/008; G01N 2203/0641; G01R 31/2822; G01R 33/323

See application file for complete search history.

(56) References Cited

U.S. PATENT DOCUMENTS

| | | | |
|---|---|---|---|
| 1,184,342 | A | 5/1916 | William |
| 4,918,491 | A | 4/1990 | Sonobe |

(Continued)

FOREIGN PATENT DOCUMENTS

| | | |
|---|---|---|
| AU | 2013290020 | 2/2015 |
| CA | 3120473 | 7/2020 |

(Continued)

OTHER PUBLICATIONS

Shaffer, J P, et al., “A read-out enhancement for microwave electric field sensing with Rydberg atoms”, Proc. SPIE vol. 10674, Quantum Technologies, 2018, 12 pgs.

(Continued)

*Primary Examiner* — Tung X Nguyen

(74) *Attorney, Agent, or Firm* — Henry Patent Law Firm PLLC

(57) ABSTRACT

In a general aspect, a quantum spectrum sensing network for detecting electromagnetic radiation in an environment is presented. In some implementations, a spectrum sensing network includes a computer system; and a plurality of portable systems spatially distributed over a geographic region. Each of the plurality of portable systems includes one or more vapor cell sensors each including a vapor and being configured to generate output optical signals based on interactions between input optical signals, the vapor and electromagnetic radiation; a portable control package including one or more processors configured to process the output optical signals; and a communication module configured to communicate, to the computer system, data based on the processed output optical signals.

22 Claims, 11 Drawing Sheets

(56) References Cited

U.S. PATENT DOCUMENTS

| | | | | |
|---|---|---|---|---|
| 6,493,091 | B2 | 12/2002 | Ohtsu et al. | |
| 7,323,941 | B1 | 1/2008 | Happer et al. | |
| 10,038,301 | B1 | 7/2018 | Eggleston et al. | |
| 10,509,065 | B1 | 12/2019 | Shaffer | |
| 10,564,201 | B1 | 2/2020 | Shaffer | |
| 10,605,840 | B1 | 3/2020 | Amarloo et al. | |
| 10,684,591 | B1 | 6/2020 | Burke | |
| 10,802,066 | B1 | 10/2020 | Keaveney et al. | |
| 10,823,775 | B2 | 11/2020 | Anderson | |
| 10,859,981 | B1 | 12/2020 | Ramirez-Serrano et al. | |
| 11,137,487 | B1 | 10/2021 | Amarloo et al. | |
| 11,209,473 | B2 | 12/2021 | Amarloo et al. | |
| 11,300,599 | B1 | 4/2022 | Amarloo et al. | |
| 11,307,233 | B1 | 4/2022 | Amarloo et al. | |
| 11,313,926 | B1 | 4/2022 | Amarloo et al. | |
| 11,346,877 | B2 | 5/2022 | Larsen et al. | |
| 11,366,430 | B2 | 6/2022 | Ramirez-Serrano et al. | |
| 11,391,797 | B1 | 7/2022 | Amarloo et al. | |
| 11,429,010 | B1 | 8/2022 | Nelson et al. | |
| 11,435,234 | B1 | 9/2022 | Keaveney et al. | |
| 11,658,461 | B1 | 5/2023 | Liu et al. | |
| 11,681,016 | B1 | 6/2023 | Bohaichuk et al. | |
| 11,874,311 | B1 | 1/2024 | Dixon et al. | |
| 11,899,057 | B2 | 2/2024 | Xu | |
| 12,028,084 | B2 | 7/2024 | Salim et al. | |
| 12,146,996 | B2 | 11/2024 | Mcbride | |
| 12,181,507 | B1 | 12/2024 | Majidi-ahy | |
| 12,372,849 | B1 | 7/2025 | Liu et al. | |
| 12,411,162 | B2 | 9/2025 | Burton | |
| 12,529,937 | B2 | 1/2026 | Liu et al. | |
| 2009/0143019 | A1* | 6/2009 | Shellhammer ....... | H04B 17/327<br>455/67.11 |
| 2013/0050795 | A1 | 2/2013 | Qiu et al. | |
| 2015/0372447 | A1 | 12/2015 | Song et al. | |
| 2016/0363617 | A1 | 12/2016 | Anderson et al. | |
| 2018/0188305 | A1 | 7/2018 | Hisatake | |
| 2019/0181611 | A1 | 6/2019 | Maleki et al. | |
| 2019/0293702 | A1 | 9/2019 | Midori | |
| 2020/0011913 | A1 | 1/2020 | Hisatake | |
| 2020/0345259 | A1 | 11/2020 | Garber | |
| 2021/0041513 | A1 | 2/2021 | Mohseni | |
| 2021/0080324 | A1 | 3/2021 | Rieker et al. | |
| 2021/0286063 | A1 | 9/2021 | Amarloo | |
| 2021/0373061 | A1 | 12/2021 | Hisatake | |
| 2022/0196716 | A1 | 6/2022 | Anderson et al. | |
| 2022/0228972 | A1 | 7/2022 | Nelson et al. | |
| 2022/0299584 | A1 | 9/2022 | Ledbetter | |
| 2023/0137266 | A1* | 5/2023 | McBride ................ | G01V 8/005<br>250/389 |
| 2024/0036094 | A1 | 2/2024 | Dixon et al. | |
| 2024/0413829 | A1 | 12/2024 | Anderson | |
| 2025/0085325 | A1 | 3/2025 | Bohaichuk | |
| 2025/0362360 | A1 | 11/2025 | Liu et al. | |

FOREIGN PATENT DOCUMENTS

| | | |
|---|---|---|
| IN | 452021 | 11/2021 |
| WO | 2006084313 | 8/2006 |
| WO | 2023184013 | 10/2023 |
| WO | 2024020667 | 2/2024 |
| WO | 2025241028 | 11/2025 |
| WO | 2025251145 | 12/2025 |

OTHER PUBLICATIONS

Simons , et al., “A Rydberg atom-based mixer: Measuring the phase of a radio frequency wave”, Appl. Phys. Lett. 114, Mar. 18, 2019, 5 pgs.

Spencer , et al., “An optical-frequency synthesizer using integrated photonics”, Nature 557, 81, May 3, 2018, 8 pgs.

Talvard , et al., “Enhancement of the performance of a fiber-based frequency comb by referencing to an acetylene-stabilized fiber laser”, Optics Express, 25, 3, Feb. 6, 2017, 11 pgs.

Urabe , et al., “Absorption spectroscopy using interference between optical frequency comb and single-wavelength laser”, App. Phys. Lett. 101, Jul. 31, 2012, 5 pgs.

Wu , et al., “Generation of very flat optical frequency combs from continuous-wave lasers using cascaded intensity and phase modulators driven by tailored radio frequency waveforms”, Optics Letters, 35, 19, Sep. 23, 2010, 3 pgs.

Xue , et al., “Microresonator Kerr frequency combs with high conversion efficiency”, Laser Photonics Rev. 11, Jan. 9, 2017, 7 pgs.

Zhang , et al., “Rydberg microwave frequency comb spectrometer”, arXiv:2206.06572v1, Jun. 14, 2022, 10 pgs.

USPTO, Notice of Allowance issued in U.S. Appl. No. 18/919,819 on April, 4, 2025; 25 pages.

USPTO, Corrected Notice of Allowance issued in U.S. Appl. No. 18/919,850 on Feb. 4, 2025, 9 pages.

ISA, International Search Report and Written Opinion issued in Application No. PCT/CA2025/050721 on Jul. 24, 2025, 13 pages.

ISA, International Search Report and Written Opinion issued in Application No. PCT/CA2025/050763 on Aug. 5, 2025, 10 pages.

Sugiyama, et al., “Precision dual-comb spectroscopy using wavelength-converted frequency combs with low repetition rates”, Scientific Reports, vol. 13, Feb. 13, 2023, 10 pages.

USPTO, Notice of Allowance mailed Mar. 31, 2023, in U.S. Appl. No. 18/150,110, 16 pgs.

USPTO, Non-Final Office Action issued in U.S. Appl. No. 18/296,307 on Jun. 20, 2023, 28 pages.

USPTO, Notice of Allowance issued in U.S. Appl. No. 18/296,307 on Oct. 17, 2023, 8 pages.

WIPO, International Search Report and Written Opinion issued in Application No. PCT/CA2023/050914 on Sep. 19, 2023, 8 pages.

“Ultra-Narrow Bandwidth Filters FGB, DFB & Photosensitive Fibers”, https://photonics.ixblue.com/store/fiber-bragg-gratings/ultra-narrow-bandwidth-filters#products, accessed on Apr. 7, 2024., 6 pages.

Anderson , et al., “Continuous-frequency measurements of high-intensity microwave electric fields with atomic vapor cells”, Appl. Phys. Lett. 111, Aug. 2, 2017, 6 pgs.

Anderson , et al., “Optical Measurements of Strong Microwave Fields with Rydberg Atoms in a Vapor Cell”, Phys. Rev. App. 5, Mar. 4, 2016, 8 pgs.

Black , “An introducton to Pound-Drever-Hall laser frequency stabilization”, American Journal of Physics 69, 79, Apr. 2000, 10 pgs.

Bohaichuk, Stephanie M, et al., “A Three-Photon Rydberg Atom-Based Radio Frequency Sensing Scheme with Narrow Linewidth”, arXiv:2304.07409 [physics.atom-ph], 2023, 11 pages.

Bohaichuk, Stephanie M, et al., “The Origins of Rydberg Atom Electrometer Transient Response and its Impact on Radio Frequency Pulse Sensing”, arXiv:2203.01733, Mar. 3, 2022, 21 pgs.

Deschenes , et al., “Frequency-noise removal and on-line calibration for accurate frequency comb interference spectroscopy of acetylene”, Applied Optics, vol. 53, No. 4, Feb. 1, 2014, 5 pgs.

Dixon, Katelyn , et al., “Rydberg atom-based Electrometry Using a Self-Heterodyne Frequency Comb Readout and Preparation Scheme”, arXiv:2209.02583 [physics.atom-ph], Sep. 6, 2022, 18 pages.

Dixon, Katelyn , “Rydberg atom-based Electrometry Using a Self-Heterodyne Frequency Comb Readout and Preparation Scheme”, Physical Review Applied 19, 034078, 2023, 8 Pages.

Dong, Po , et al., “GHz-bandwidth optical filters based on high-order silicon ring resonators”, vol. 18, No. 23, pp. 23784-23789, Optics Express, Oct. 27, 2010, 7 pages.

Dutta , et al., “Mode-hop-free tuning over 135 GHz of external cavity diode lasers without anti-reflection coating”, Applied Physics B, 106, 2012, 6 pgs.

Fan, Haoquan , et al., “Atom based RF electric field sensing”, Journal of Physics B: Atomic, Molecular and Optical Physics 48 202001 (2015), Sep. 9, 2015, 17 pgs.

Fan, H Q , et al., “Dispersive radio frequency electrometry using Rydberg atoms in a prism-shaped atomic vapor cell”, J.Phys. B: At. Mol. Opt. Phys. 49 (2016) 104004, 2016, 8 pgs.

Fortier , et al., “20 years of developments in optical frequency comb technology and applications”, Communications Physics, Dec. 6, 2019, 16 pgs.

(56) References Cited

OTHER PUBLICATIONS

Gagliardi , et al., "Sub-Doppler spectroscopy of H2 18O at 1.4um", App. Phys. B 70, Mar. 24, 2020, 6 pgs.
Geng , et al., "Photonic integrated circuit implementation of a sub-GHz-selectivity frequency comb filter for optical clock multiplication", Optics Express 25, Oct. 30, 2017, 11 pgs.
Gordon, Joshua A, et al., "Millimeter Wave Detection via Autler-Townes Splitting in Rubidium Rydberg Atoms", Applied Physics Letters, 105(2):024104, Jun. 2014, 5 pages.
Hasan , et al., "Integrated optical SSB modulation / frequency shifting using cascaded silicon MZM", IEEE Photonics Technology Letters, 2020, 5 pgs.
Hebert , et al., "Real-Time Dynamic Atomic Spectroscopy Using Electro-Optic Frequency Combs", Oct. 25, 2016, 9 pgs.
Hebert , et al., "Self-heterodyne interference spectroscopy using a comb generated by pseudo-random modulation", Optics Express, Oct. 14, 2015, 13 pgs.
Holloway , et al., "Broadband Rydberg Atom-Based Electric-Field Probe: From Self-Calibrated Measurements to Sub-Wavelength Imaging", arXiv:1405.7066v1, May 27, 2014, 12 pgs.
Holloway , et al., "Sub-Wavelength Imaging and Field Mapping via EIT and Autler-Townes Splitting in Rydberg Atoms", arXiv:1404.0289v1, Apr. 1, 2014, 12 pgs.
Holzwarth , et al., "Optical Clockworks and the Measurement of Laser Frequencies With a Mode-Locked Frequency Comb", IEEE J. of Quantum Electronics 37, Dec. 2001, 9 pgs.
Ji , et al., "Exploiting Ultralow Loss Multimode Waveguides for Broadband Frequency Combs", Laser & Photonics Reviews 15, 2000353, 2021, 14 pgs.
Jin, Warren , et al., "Piezoelectrically tuned silicon nitride ring resonator", vol. 26, No. 3 , pp. 3174-3187 Optics Express, Jan. 30, 2018, 14 pages.
Jin , et al., "Piezoelectrically tuned silicon nitride ring resonator", Optics Express 26, Feb. 5, 2018, 14 pgs.
Jing , et al., "Atomic superheterodyne receiver based on microwave-dressed Rydberg spectroscopy", Nature Physics, vol. 16, Sep. 2020, 11 pgs.
Kim, Bok Young, et al., "Turn-key, high-efficiency Kerr comb source", arXiv:1907.07164 [physics.optics], Jul. 16, 2019, 5 pages.
Kumar , et al., "Atom-Based Sensing of Weak Radio Frequency Electric Fields Using Homodyne Readout", Scientific Reports 7:42981, Feb. 20, 2017, 10 pgs.
Kumar , et al., "Rydberg-atom based radio-frequency electrometry using frequency modulation spectroscopy in room temperature vapor cells", Optics Express, vol. 25, No. 8, Apr. 17, 2017, 13 pgs.
Liu, Chang , et al., "Stable, narrow-linewidth laser system with a broad frequency tunability and a fast switching time", Optics Letters 49, 399 (2024), Dec. 8, 2023, 6 pages.
Long , et al., "Multiplexed sub-Doppler spectroscopy with an optical frequency comb", Phys. Rev.A, Dec. 2016, 10 pgs.
Marangos , et al., "Electromagnetically induced transparency", J. Modern Optics 45, 3, 1998, 33 pgs.
Metcalf , et al., "Stand-Alone High-Power Broadly Tunable Optoelectronic Frequency Comb Generator", OFC/NFOEC Technical Digest, JW2A. 15, 2013, 3 pgs.
Noaman, Mohammad , et al., "Rydberg-Atom Sensors in Bichromatic Radio-Frequency Fields", Phys. Rev. Applied 20, 024068., Aug. 28, 2023, 6 pages.
Noaman, M , et al., "Vapor Cell Characterization and Optimization for Applications in Rydberg Atom-Based Radio Frequency Sensing", Proceedings vol. 12447, Quantum Sensing, Imaging, and Precision Metrology; 124470V, Mar. 8, 2023, 6 pages.
Okoshi, T. , et al., "Novel Method for High Resolution Measurement of Laser Output Spectrum", Electronics Letters, vol. 16 No. 16, Jul. 31, 1980, 2 pages.
Ozharar , et al., "Ultraflat Optical Comb Generation by Phase-Only Modulation of Continuous-Wave Light", IEEE Photonics Technology Letters, Jan. 1, 2008, 3 pgs.
Parriaux , et al., "Electro-optic frequency combs", Advances in Optics and Photonics, vol. 12, No. 1, Mar. 16, 2020, 65 pgs.
Picque , "Frequency comb spectroscopy", Nature Photonics, vol. 13, Mar. 2019, 12 pgs.
Rozwadowski , et al., "Measurement of the Density of Saturated Cesium Vapor by an Optical Method", The Journal of Chemical Physics, May 18, 2004, 5 pgs.
Saliba , et al., "Mode stability of external cavity diode lasers", Applied Optics, 48, Dec. 10, 2009, 11 pgs.
Schmidt, Matthias , et al., "Rydberg atom-based radio frequency sensors: amplitude regime sensing", arXiv:2307.00121v1 [physics.atom-ph], retrieved on Jun. 30, 2023, 33 pages.
Schwettmann , et al., "Field-programmable gate array based locking circuit for external cavity diode laser frequency stabilization", Rev.Sci. Instrum. 82, Oct. 7, 2011, 7 pgs.
Sedlacek , et al., "Atom-Based Vector Microwave Electrometry Using Ribidium Rydberg Atoms in a Vapor Cell", Physical Review Letters, Aug. 6, 2013, 5 pgs.
Sedlacek , et al., "Microwave electrometry with Rydberg atoms in a vapour cell using bright atomic resonances", Nature Physics 8, Nov. 2012, 6 pgs.
USPTO, Non-Final Office Action issued in U.S. Appl. No. 18/919,860 on Jan. 20, 2026, 13 pages.

* cited by examiner

QUANTUM SPECTRUM SENSING NETWORKS

CROSS-REFERENCE TO RELATED APPLICATIONS

This application claims priority to U.S. Provisional Ser. No. 63/655,490, filed Jun. 3, 2024, entitled "Portable Quantum Spectrum Sensing Systems." The above-referenced priority document is incorporated herein by reference.

TECHNICAL FIELD

The following description relates to quantum spectrum sensing (QSS) networks.

BACKGROUND

Wireless communication systems, including 5G and 6G wireless communication systems operating in both microwave (FR1, <7.125 GHz) and millimeter-wave (FR2, >24.250 GHz) bands, use directional beamforming antenna arrays to generate wireless signals. These antenna arrays can be tested to detect problems and to monitor their performance. For example, over-the-air (OTA) testing can be used to characterize the performance of cellular base station antenna arrays.

DETAILED DESCRIPTION

Figure 1:
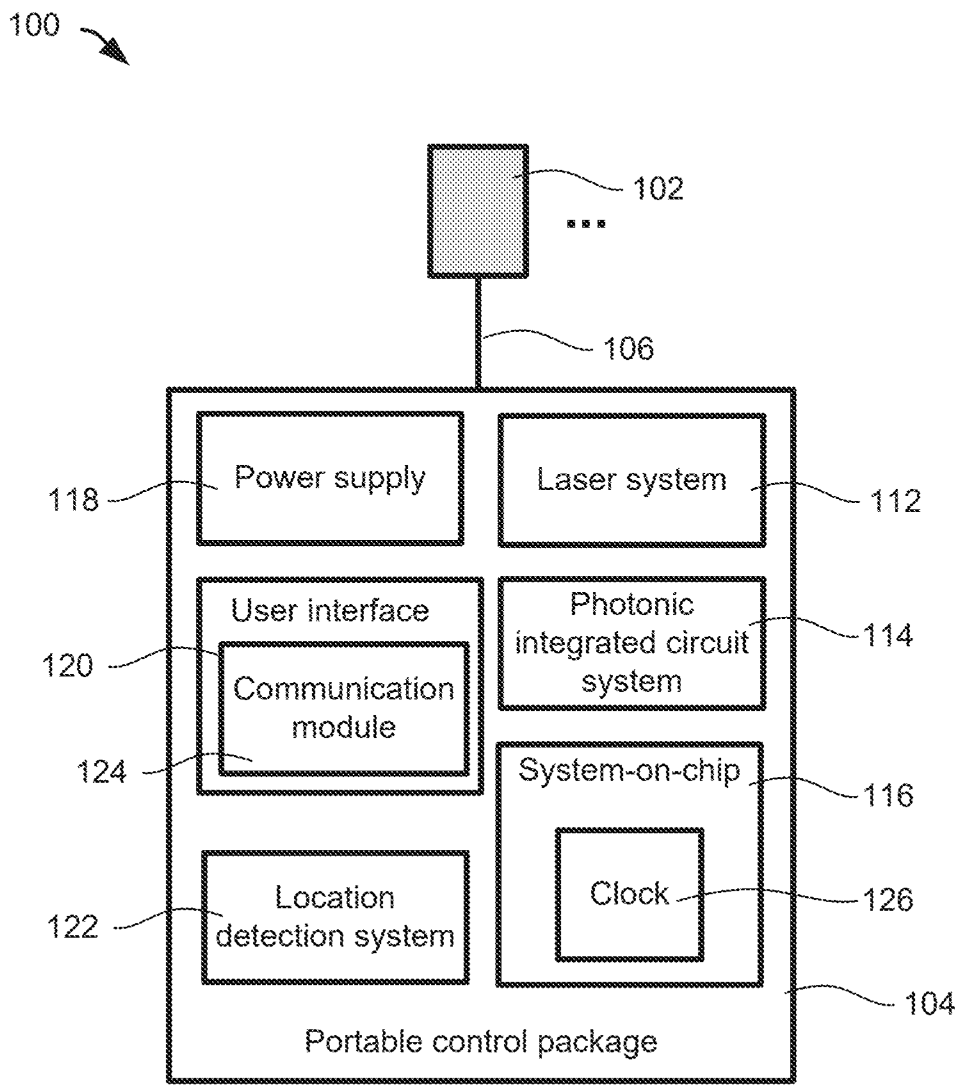
FIG. 1 is a block diagram showing aspects of an example portable QSS system.

In a general aspect, portable quantum spectrum sensing (QSS) systems are described. Portable QSS systems can be used in a variety of applications, for example, to detect electromagnetic radiation in an environment. In some implementations, a portable QSS system includes a portable control package and one or more vapor cell sensors. In some instances, the portable control package includes a laser system, a photonic integrated circuit system, a system-on-chip and possibly other components.

In some implementations, technologies like photonic integrated circuits and semiconductor amplifiers, used in constructing portable QSS systems allow the size, weight, and power consumption (SWaP) of the portable QSS systems to be reduced; and thus enable a portable QSS system to be carried by a single person or multiple persons. In some instances, portable QSS systems can be used to detect electromagnetic radiation in the field, for example, from a variety of sources. In certain instances, portable QSS systems can measure nonlinear, linear, and electromagnetic field compliance (EMC)/electromagnetic interference (EMI) using over-the-air measurement. Portable QSS systems may also be used for signals intelligence and electronic warfare spectrum sensing support. For example, a portable QSS system may be operated in a networked, frontline capacity and may be used as a tool for identifying RF signals on the battlefield. A network of multiple portable QSS systems can each sense electromagnetic radiation, and data from the multiple portable QSS systems can be fused by operation of a central computer system of the network. The computer system may process data from multiple portable QSS systems, for example, to eliminate clutter and determine via triangulation the location of emitters operating over a >100 GHz spectral bandwidth, movement of emitters, and other information. Portable QSS systems may also be used to characterize electromagnetic radiation in a wireless communication environment, to optimize RF equipment such as by minimizing side lobe emission from antennas, increasing the survivability of such equipment. Portable QSS systems can be easier to operate in some cases, for example, performing a variety of operations without requiring a change of RF equipment, like cabling and antennas. In some implementations, a portable QSS system can support real-time spectrum analysis (RTSA) to allow faster measurement and provide accurate information.

In some implementations, portable QSS systems use Rydberg-atom-based vapor cells as sensors. Rydberg atom-based vapor cell sensors can provide a number of advantages, in various contexts. For instance, Rydberg-atom-based vapor cells are not typically damaged by large RF signals, such as electromagnetic pulses or other types of high-power jamming signals in electronic warfare or radar pulses, when using the device to calibrate RF equipment in the field. Therefore, it can provide a unique jamming-resistance and resilience for these use cases. Rydberg-atom-based vapor cells may be implemented without active electronics, such as a low-noise amplifier (LNA), which enables passive sensing. Accordingly, Rydberg-atom-based vapor cells may operate without generating any additional RF frequency signal components (in particular under nonlinearity). Therefore, a portable QSS system may provide a non-detectable, spectrum sensing system of interest to electronic warfare spectrum sensing use cases. In some instances, a Rydberg-atom-based vapor cell sensor of a portable QSS system can be hardened and ruggedized for outdoor, field portability and environmental conditions, including temperature, humidity, shock, vibration. In some instances, a portable QSS system can significantly improve time and efficiency of site surveys for wireless infrastructure and base stations, including for 5G and 6G. Site surveys for 5G-6G base stations may focus on both microwave (FR1, <7.125 GHZ) and millimeter-wave (FR2, >24.250 GHz) bands of the radio frequency (RF) spectrum. Signal identification may include all signals present in an ultra-broadband bandwidth (0.1-100 GHz, as an example).

In some examples, Rydberg atom-based sensors in a portable QSS system provide technical advantages and improvements such as, for example, self-calibration, omnidirectionality, and large carrier bandwidth (0.03-300 GHz, for example). Such systems can offer field and R&D OTA solutions for the rapidly advancing RF technology associated with 5G-6G and electronic warfare spectrum sensing. In some implementations, the systems and techniques described here can offer advantages such as detecting over the ultra-broadband frequency range for 5G-6G site surveys as well as for electronic warfare spectrum sensing, without changing the sensor hardware. In some implementations, the systems and techniques described here can improve accuracy of measurements. For example, the portable QSS systems can be inherently self-calibrated and stable since atoms are used as the sensor, enabling measurements at different times and locations to be compared quantitatively. In some instances, using portable QSS systems can reduce the cost of characterizing electromagnetic radiation.

In some instances, multiple portable QSS systems can be placed in frontline units or in squads which can be distributed at different positions to form a QSS network. The distributed QSS network with multiple portable QSS systems can be highly redundant to provide additional robustness. Placing the portable QSS systems at the front lines can reduce the requirements on sensitivity since the range to the enemy systems is reduced. Distributing the portable QSS systems also allows for sensor fusion of incoming signals at different spatial positions and times. Receiving the signals at different geolocations and times enables triangulation to locate the positions of emitters and enables decluttering, e.g., the removal of signals scattering from varying topography or buildings to better distinguish the position of emitters. In some instances, the methods and systems presented here can save lives by reducing the observe-orient-decide-act (OODA) cycle.

In some implementations, a QSS network which includes multiple portable QSS systems distributed at multiple locations can enable macro-diversity for detection of RF signals, which significantly enhances accuracy of detection for both electronic warfare spectrum sensing and 5G/6G infrastructure use-cases. QSS networks may enable more accurate spatial spectrum mapping by using multiple-orchestrated units, for example for multiple soldiers in the field, each carrying a backpack containing a portable QSS system (e.g., the example systems 100, 200, 500, 600 shown in FIGS. 1, 2, 5, 6A-6B) which includes optics and electronics components in the backpack with at least one vapor cell sensor. The portable control package may include a clock, a location detection system, a communication module (e.g., optical or RF wireless) to send and receive communications with a central computer system (e.g., a data center), or a combination of these and possibly other components and features. In some instances, a portable QSS system may be carried by other types of carriers, such as drone, vehicles, etc.

In some cases, a distributed passive spectrum sensing network which includes multiple portable QSS systems, each including multiple vapor cell sensors, can improve micro-diversity of RF signal detection. For instance, each portable QSS system can be reconfigured to concentrate on different sections of the spectrum or perform broad bandwidth scans or some combination of both at a particular site. The geometry of the vapor cell sensors can be reconfigured at each site to match local conditions, for example, local topography. The distributed passive spectrum sensing network of individual sites can significantly enhance the accuracy of spatial spectral-mapping when combined with macro-diversity as multiple-orchestrated units. For example, multiple soldiers operating a portable QSS system in the field can collect data and send it to a data fusion center where it can by synthesized and distributed to decision makers. The distributed spectrum sensing network allows spatial and temporal spectrum mapping of amplitude and temporal changes of various RF signals emanating from nearby base-stations or other wireless infrastructure, including aviation radars, can be measured.

FIG. 1 is a schematic diagram showing aspects of an example portable QSS system 100. The example portable QSS system 100 includes a vapor cell sensor 102 and a portable control package 104 communicably connected to the vapor cell sensor 102. As shown in FIG. 1, the vapor cell sensor 102 is coupled to the portable control package 104 via a transmission medium 106, e.g., optical fibers or other optical communication links. The portable QSS system 100 may include additional or different features, and the components of the portable QSS system 100 may operate as described with respect to FIG. 1 or in another manner. For example, the portable QSS system 100 may include multiple vapor cell sensors 102. In some instances, the portable QSS system 100 can be configured to perform some or all of the operations in the example processes 700, 900 shown in FIGS. 7 and 9; or the portable QSS system 100 may operate in another manner.

In some implementations, the portable QSS system 100 is configured to provide absolute, self-calibrated measurement over an ultra-broadband carrier bandwidth (e.g., 1 to 100 GHz) as a spectrum analyzer. For instance, these and potentially other capabilities may be provided by using a non-perturbative, all dielectric vapor cell sensors. The example portable control package 104 is compact, portable, lightweight; and thus, can be carried in a portable storage bag, e.g., backpack. For example, the portable QSS system 100 can be carried by a field technician and used for characterizing emissions from communication nodes in a wireless communication network, e.g., a node B, an E-utran Node B (also known as Evolved Node B, eNodeB or eNB), a pico station, a femto station, or other another type of communication node. The ultra-broadband nature of the portable QSS system 100 can be used to characterize or conformance-testing of 5G-6G base station transmitters in the field by determining properties of the wireless signals transmitted in a wireless network environment. For another example, the portable QSS system 100 can be carried by a soldier and used for characterizing emissions from wireless communication infrastructures (e.g., radar systems, satellite communication systems, microwave links, etc.) in an electronic warfare environment. In some instances, the portable QSS system 100 may be used for determining properties of wireless signals in another environment.

As shown in FIG. 1, the example portable QSS system 100 includes a vapor cell sensor 102, which can be implemented as a Rydberg atom-based vapor cell sensor. In some instances, the vapor cell sensor 102 includes a vapor in an enclosed volume (e.g., in a vapor cell). The vapor is used as a medium to interact with electromagnetic radiation (e.g., the wireless signals). In some implementations, the vapor cell sensor 102 utilizes the quantum states of Rydberg atoms for absolute measurement of electromagnetic radiation. In some instances, the vapor cell sensor 102 may be implemented as a metrology vapor cell, a glass vapor cell, a microelectromechanical system (MEMS) vapor cell, or another type of engineered vapor cell based on metamaterial or photonic crystal principles.

In some aspects of operation, RF radiation or other electromagnetic radiation are received by the vapor cell sensor 102, and the RF radiation passes through a window (e.g., formed of the dielectric material) of the vapor cell sensor 102 to interact with the vapor residing in the vapor cell sensor 102. During such interaction, input optical signals from the portable control package 104 can be communicated to the vapor cell sensor 102. The input optical signals pass through atoms in the vapor, which undergo a change in optical transmission due to the presence of the electromagnetic radiation; and output optical signals can be generated based on the interaction between the input optical signals, the vapor and the electromagnetic radiation. In some implementations, the generated output optical signals from the vapor cell sensor 102 are used to determine properties of the wireless signals. In some implementations, the properties of the wireless signals can be used to determine the power of the wireless signal emitted from the cellular base station, to determine the location of the sources of the wireless signals, or for other purposes.

In some instances, when used in the field, the vapor cell of the vapor cell sensor 102 can be hermetically sealed and packaged in an electromagnetically transparent dielectric material, such as polylactic acid (PLA) plastic materials and other dielectric materials. The vapor cell can be mast mounted (e.g., on a telescopic mast or another type of mast) or fixed to another type of support structure, like a tripod, for supporting the vapor cell and its associated optical components (e.g., waveguides, optical connectors, etc.) at their respective locations. In some instances, when the portable QSS system 100 includes multiple vapor cell sensors 102, the multiple vapor cell sensors 102 may be configured in an array and oriented in the same or different directions. For example, the portable QSS system 100 may be implemented as the example portable QSS systems 600, 620 shown in FIGS. 6A-6B or in another manner. In this case, the array of vapor cell sensors may be supported by a support structure at their respective locations in the array. In some instances, the multiple vapor cell sensors may be configured in the two-dimensional array shown in FIG. 6B or in any other one-dimensional, two-dimensional, or three-dimensional arrays. The multiple vapor cell sensors in the array can be communicably connected to the shared portable control package 104 through an array of optical channels that connect the array with the portable control system.

In some implementations, the vapor cell sensor 102 is formed at least in part (wholly or partially formed) of a dielectric material that is transparent to the electromagnetic radiation. The vapor cell sensor 102 may be of the type described, for example, in the publication "Microwave electrometry with Rydberg atoms in a vapor cell using bright atomic resonances," by J. A. Sedlacek, et al. (*Nature Physics* 8, 819-824, 2012). Other types or configurations of a vapor cell sensor 102 may be used in some cases. The dielectric material may define a window for the vapor cell sensor 102, through which the electromagnetic radiation is received. Examples of the dielectric material include silicon, silicate-based glasses, and quartz. The vapor cell sensor 102 may include atoms in a vapor state (e.g., vaporized $^{87}$Rb or $^{133}$Cs) that alter an optical transmission in response to the electromagnetic radiation. The optical transmission may be influenced by optical transitions of the atoms in the vapor state. In some instances, the output optical signal from the vapor cell sensor 102 can be generated using electromagnetically induced transparency (EIT) or electromagnetically induced absorption (EIA). In some instances, a sub-Doppler method is useful for higher spectral resolution in the Autler-Townes regime and higher sensitivity.

In some instances, the generated output optical signals are independent of an orientation of the dielectric cell relative to the source of the electromagnetic emission. For example, the vapor cell sensor 102 may be rotated without impacting the output optical signals generated by the vapor cell sensor 102. In other words, the vapor cell sensor 102 can be omni-directional such that its operation is invariant under spatial rotations, providing a higher degree of stability. In some instances, the vapor cell sensors of the portable QSS system can be small sensors designed for electromagnetic transparency, for example, MEMs-based vapor cells, glass vapor cells, glass and silicon vapor cells, or other types of vapor cell sensors, for example, as described in U.S. Pat. Nos. 11,300,599, 11,307,233, 11,899,057, 11,391,797, 11,313,926, 11,366,430, 10,859,981, and 10,605,840.

As shown in FIG. 1, the portable QSS system 100 further includes a portable control package 104 configured to generate/communicate input optical signals to the vapor cell sensor 102; and to receive/process output optical signals from the vapor cell sensor 102. As shown in FIG. 1, the portable control package 104 includes a laser system 112, a photonic integrated circuit system 114, a system-on-chip 116, a power supply 118, a user interface 120, a location detection system 122, and a clock 126. In some instances, the portable control package 104 may include other components.

In some implementations, the laser system 112 includes two or more lasers configured to generate two or more direct laser output signals. For example, the laser system 112 includes a probe laser configured to generate a direct probe laser output signal, and a coupling laser configured to generate a direct coupling laser output signal. In some instances, the laser system 112 of the QSS system 100 may include semiconductor lasers. In some instances, the laser system 112 may include RF optics such as a lens or parabolic dish to increase the sensitivity. In some instances, each of the two or more lasers may be a fiber laser, a distributed feedback (DFB) laser, or a Bragg reflector (DBR) laser. In some instances, each of the two or more lasers of the laser system 112 may be a continuous wave (CW) laser, a narrow-linewidth tunable laser, for example, using external cavity diode laser (ECDL) technology, or other types of lasers. In some instances, the two or more laser signals generated by the laser system 112 are locked to a stable, narrow bandwidth reference such as a frequency comb, interferometer, atomic or molecular absorption line, or another type of reference. In some instances, each of the lasers of the laser system 112 may be connected to a corresponding frequency reference (e.g., absolute or approximately absolute) or a laser stabilizer configured to lock the frequency of the direct laser output signal from the laser. For example, an absolute reference may be an interferometer (e.g., a Fabry-Perot cavity) or a molecular or atomic spectral feature. In some instances, the laser system 112 may include multiple agile laser system (e.g., two or more coupling laser systems), for example, at different frequencies to provide closed loop systems for reading out phase optically. In some instances, other multi-photon detection schemes may be possible.

In some implementations, the photonic integrated circuit system 114 is configured to receive the direct laser output signals from the laser system 112 and process the direct laser output signals to generate the input optical signal to the vapor cell sensor 102. In some instances, the photonic integrated circuit system 114 may include one or more chips, each of which includes multiple photonic components integrated together. In some instances, the photonic integrated circuit system 114 is configured to perform functions related to the generation, manipulation, and detection of light on a compact chip. In some instances, the photonic integrated circuit system 114 can enable the miniaturization of optical systems by integrating multiple photonic functions on a single chip; can reduce size, weight, and power consumption. In some instances, the photonic integrated circuit system 114 can operate at very high data rates and less signal loss. The photonic integrated circuit system 114 can be scalable and cost-effective for mass production. In some instances, the photonic integrated circuit system 114 can be based on various material platforms, including silicon, indium phosphide, silicon nitride, and other material platforms.

For example, the photonic integrated circuit system 114 includes a first comb generator configured to receive a direct probe laser output signal from a probe laser and generate a first frequency comb signal; and a second comb generator configured to receive a direct coupling laser output signal and generate a second frequency comb signal. Each of the first and second frequency comb signals is an optical signal produced by the first or second comb generators; and each of the first and second frequency comb signals has a comb-shaped frequency profile that is defined by comb lines at respective comb frequencies. In some implementations, each of the first and second comb generators includes a photonic integrated circuit made of thin film lithium niobate for electro-optic comb generation. In some instances, each of the first and second comb generators may be based on an electro-optic modulator, a mode-locked laser, an optical micro-resonator, a nonlinear optical fiber, an acousto-optic modulator, or another type of optical comb generator. In some instances, when the portable QSS system 100 includes multiple vapor cell sensors 102, the multiple vapor cell sensors can be configured to receive respective frequency components of the second frequency comb signal. In other words, each vapor cell sensor is configured to receive one or more respective frequency components of the second frequency comb signal. In some instances, the multiple vapor cell sensors operating at multiple frequencies can provide micro-diversity information in the field.

In some implementations, the photonic integrated circuit system 114 includes one or more optical amplifiers configured to receive and amplify the direct laser output signals prior to being processed by the respective comb generators. For example, the photonic integrated circuit system 114 includes an optical amplifier to receive the direct probe laser output signal; and the amplified probe laser signal can then be received and processed by the first comb generator. The photonic integrated circuit system includes an optical amplifier to receive the direct coupling laser output signal; and the amplified coupling laser signal can then be received and processed by the second comb generator. In some instances, the multiple optical amplifiers may be configured and connected in another manner in the photonic integrated circuit system 114.

In some implementations, the photonic integrated circuit system 114 includes a frequency separator which is configured to receive the second frequency comb signal and select one or more frequency components from the second frequency comb signal. In some instances, the photonic integrated circuit system 114 may include a switch/filter module including a switch network and a network of drop-out filters. In some instances, the switch network may be configured to select one or more frequency components in the second frequency comb signal. In some instances, the switch network includes an electro-optic switching network. In some instances, the network of drop-out filters can be tuned near each frequency component of the second frequency comb signal. In this case, the outputs of the drop-out filters may be combined, in whole or in part. In some instances, the drop-out filters can be tuned by using micro-heaters or piezoelectric elements.

In some implementations, the photonic integrated circuit system 114 includes a frequency fine-tuning module. The frequency fine-tuning module includes one or more fine-tunning elements each configured to apply a frequency shift to one or more frequency components of the second frequency comb signal. The input optical signal to the vapor cell sensor 102 may include one or more shifted frequency components from the second frequency comb signal. In these implementations, the switching speed of the coupling laser system may be determined by the switches used and the frequency relock time of a radio frequency oscillator driving the frequency fine-tuning module. Moreover, the spectral linewidth may be determined by the spectral bandwidth of the optical clock, which can be less than 1 Hz in certain cases. Many atomic physics applications require laser light with a spectral bandwidth of less than 1 MHz. In some instances, such as when the coupling laser system switches, its spectral bandwidth may be limited by a time bandwidth product. For example, if the switching time is 1 us then the coupling laser system may dwell for 10 μs to achieve a spectral bandwidth of 100 kHz. However, such a dwell time can be faster than the unlocking and relocking of a conventional laser.

In some instances, the system-on-chip 116 includes one or more chips which consolidate various electronic components needed to form a computing system. For example, the system-on-chip 116 may include one or more processors, one or more memory units, and one or more input/output (I/O) ports. In some instances, the system-on-chip 116 may include one or more digital signal processors, wireless communication modules, and other components. The system-on-chip 116 can integrate numerous components into a single chip reducing the overall size of the QSS system and the power consumption.

In some implementations, the system-on-chip 116 includes a radio frequency (RF) integrated circuit specifically designed to operate at radio frequencies (RF). In some instances, the RF integrated circuit of the system-on-chip 116 includes various components that are configured to perform functions such as generation, transmission, reception, and processing of RF signals. For example, the RF integrated circuit of the system-on-chip 116 may include amplifiers, oscillators, filters, modulators, switches, attenuators, optical detectors, transmission lines, and other devices and components for performing RF functions. In some instances, the system-on-chip 116 is configured to communicate control signals to devices and components of the laser system 112 to generate the two or more laser signals. In some instances, the system-on-chip 116 can be configured to communicate control signals to devices and components of the photonic integrated circuit system 114 to process the two or more laser signals to generate the input optical signals, which may be directed through the vapor in the vapor cell sensor 102 to probe and measure the response of the vapor to the received electromagnetic radiation. In some instances, the system-on-chip 116 may include respective controllers for respective components of the laser system 112 and the photonic integrated circuit system 114. For example, the system-on-chip 116 may include a comb controller, a switch controller, a fine-tuning controller, or other controllers for communicating control signals. For example, the system-on-chip 116 may include the respective controllers shown in the example portable QSS system 200 shown in FIG. 2. In some instances, the controllers can interact with a master controller (typically a computer processor), where each functional element runs as a server. Each server delivers and receives information that is used by the user and autonomous control systems to run the system. In certain examples, FPGAs and GPUs, as well as other electronic systems, can be used to form a hybrid control system.

In some implementations, the system-on-chip 116 may be configured to detect the output optical signals from the vapor cell sensor 102, e.g., by operation of an optical detector. The optical detector senses changes in the transmission caused by the electromagnetic radiation at the vapor cell sensor 102. The system-on-chip 116 can convert an output electrical signal generated by the optical detector to digital data. In some implementations, the system-on-chip 116 includes a signal processing system configured to process the output optical signals. The digitized output optical signal can be processed by operation of the signal processing system to determine properties of the electromagnetic radiation experienced by the vapor over the time period when the output optical signals were generated. In some implementations, the digitized output optical signal is transformed from the time domain to the frequency domain. In some instances, the transformation may include a wavelet transformation, a Fourier transformation, a Legendre transformation, a Hilbert transformation, or other related transformations for signal processing. In some instances, the system-on-chip 116 may process the digitized output optical signal to determine at least one of a start time, a duration, an amplitude, a frequency, a polarization, and other properties of the electromagnetic radiation experienced by the vapor during the time period. In some instances, determining the properties of the electromagnetic radiation may be performed locally at the QSS system or remotely at a central computer system of a QSS network. In some instances, the system-on-chip 116 may include other devices and components; and may be configured to perform other functions.

As shown in FIG. 1, the system-on-chip 116 of the portable control package 104 includes a clock 126 for absolute timing. In certain examples, the clock 126 may be an atomic clock, a thermally stabilized crystal oscillator, a GPS steered atomic clock, a chip scale atomic clock, or another type of accurate stable clock. In some implementations, the clock 126 is configured to provide timing data associated with the output optical signals generated by the vapor cell sensor 102. In some instances, when the properties of the electromagnetic radiation are determined locally at the QSS system 100, the timing data can be associated with the properties of the electromagnetic radiation.

In some instances, the portable control package 104 may include a memory unit configured to store data and computer-readable codes that can be executed. The data and the computer-readable code may be made available (e.g., in whole or in part) to users or other systems via the user interface 120 of the portable control package 104. The computer-readable code may be modified or updated (e.g., based on user input or other information) to modify values of control parameters of the system-on-chip 116, values of processing parameters of the system-on-chip 116, or values of other parameters. For example, the digitized and transformed output optical signals associated with a vapor cell sensor 102 as a function of time can be stored in the memory unit. The user interface 120 may also be used to run diagnostics to monitor the health of the portable QSS system 100. In some instances, the portable control package 104 includes an autonomous system, which may interface with a user through the interface 120 or otherwise. In some instances, the autonomous system may be configured to automatically run in the background to perform functions such as maintaining the laser frequencies at fixed values, maintain laser power, apply signal processing, e.g., using matched filters, etc.

In some instances, the user interface 120 may provide communication with other portable QSS systems or devices (e.g., a central computer system or a data hub of a QSS network). As shown in FIG. 1, the user interface 120 includes a communication module 124 that can provide wireless communication under various wireless protocols, such as, for example, Bluetooth, Wi-Fi, Near Field Communication (NFC), GSM voice calls, SMS, EMS, or MMS messaging, wireless standards (e.g., CDMA, TDMA, PDC, WCDMA, CDMA2000, GPRS) among others. Such communication may occur, for example, through a radio-frequency transceiver or another type of component. In some implementations, the wireless communication module 124 is an optical communication module which includes optical transmitter and receivers for communicating optical signals over a transmission media (e.g., optical fibers). In some instances, the optical communication module can allow the QSS system 100 to be optically connected to other QSS systems or devices (e.g., the central computer system or the data hub). The communication module 124 allows the QSS system 100 to exchange information with other QSS systems or data centers directly or through an intermediary entity (e.g., satellite, airplane, etc.) to facilitate the communication. In some cases, the user interface 120 includes a wired communication interface (e.g., USB, Ethernet, etc.) that can be connected to one or more input/output devices, such as, for example, a keyboard, a pointing device, a scanner, or a networking device such as a switch or router, for example, through a network adapter.

In some implementations, the communication module 124 is configured to communicate with one or more other portable QSS systems 100 on one or more wireless communication channels to form a QSS network. For example, a communication module 124 may include a transceiver module including RF transmitter and receiver circuitry coupled to one or more antennas that can support a particular wireless communication protocol. In some implementations, the QSS network is a distributed passive spectrum sensing network which includes a central computer system and multiple portable QSS systems which are distributed at different geolocations and are wirelessly connected to the central computer system. In some instances, the central computer system includes a computer processor, a memory unit, and a wireless communication module. In certain examples, a central computer system can be a portable QSS system 100 or another computer system. In some implementations, the central computer system in the QSS network is configured to receive respective geolocation data and respective processed output optical signals from respective portable QSS systems via respective wireless communication channels; and can perform further processing of the respective geolocation data and the respective processed output optical signals. The central computer system can determine the properties of the electromagnetic radiation based on the output optical signals; change configurations of the portable QSS systems to perform different measurements (e.g., in a different frequency range, longer dwelling time, etc.); share overall configuration information of the QSS network with the portable QSS systems in the network; and other functions.

In some implementations, the QSS network is configured to determine the macro-diversity of electromagnetic radiation at different geolocations, to perform a spatial spectrum mapping of the electromagnetic radiation at different geolocation, to perform decluttering based generated results. For example, receiving the signals at different geolocations and times enables triangulation to locate the positions of emitters and decluttering, e.g., removing signals scattering from varying topography or buildings to better distinguish the position of emitting source of the detected electromagnetic emissions. In some instances, the QSS network may include redundant portable QSS systems; to maintain the functionality of the distributed spectrum sensing network; and to minimize data losses caused by failed nodes in the QSS network. In certain instances, the QSS network may be implemented as the example network 800 shown in FIG. 8 operated according to the example process 900 in FIG. 9, or in another manner.

In some instances, the location detection system 122 may be a Global Navigation Satellite System (GNSS) receiver configured to provide location information of the vapor cell sensor 102. For example, the location detection system 122 in the portable QSS system 100 may be compatible with at least one of the following technologies, Global Positioning System (GPS), GLObal Navigation Satellite System (GLONASS), Galileo, or Beidou. Another type of geolocation device or system may be used to provide location information, in some cases. In some instances, the location detection system 122 is configured to determine the measurement location of the vapor cell sensor 102; and provide geolocation data associated with vapor cell sensor 112 from which the output optical signal is received.

In some implementations, the laser system 102, the photonic integrated circuit system 114, and the system-on-chip 116, the power supply 118, the user interface 120, the location detection system 122, and other devices or components of the portable control package 104 may be housed in a housing of the portable control package 104. In some implementations, the vapor cell sensor 102 resides outside the housing of the portable control package 104. In some instances, the example portable QSS system 100 may be disposed on a mobile platform, such as a service van. The mobile platform may be operable to transport at least the vapor cell sensor 102 of the portable QSS system 100 to other measurement locations. In some instances, the portable QSS system 100 may remain fixed in place relative to the cellular base station, radar station, or other emitter sources, allowing changes in emission over a period of time to be more easily tracked. In some instances, components of the portable QSS system 100 can be powered by the power supply 118. The power supply 118 may be a battery unit for remote field testing.

Figure 2:
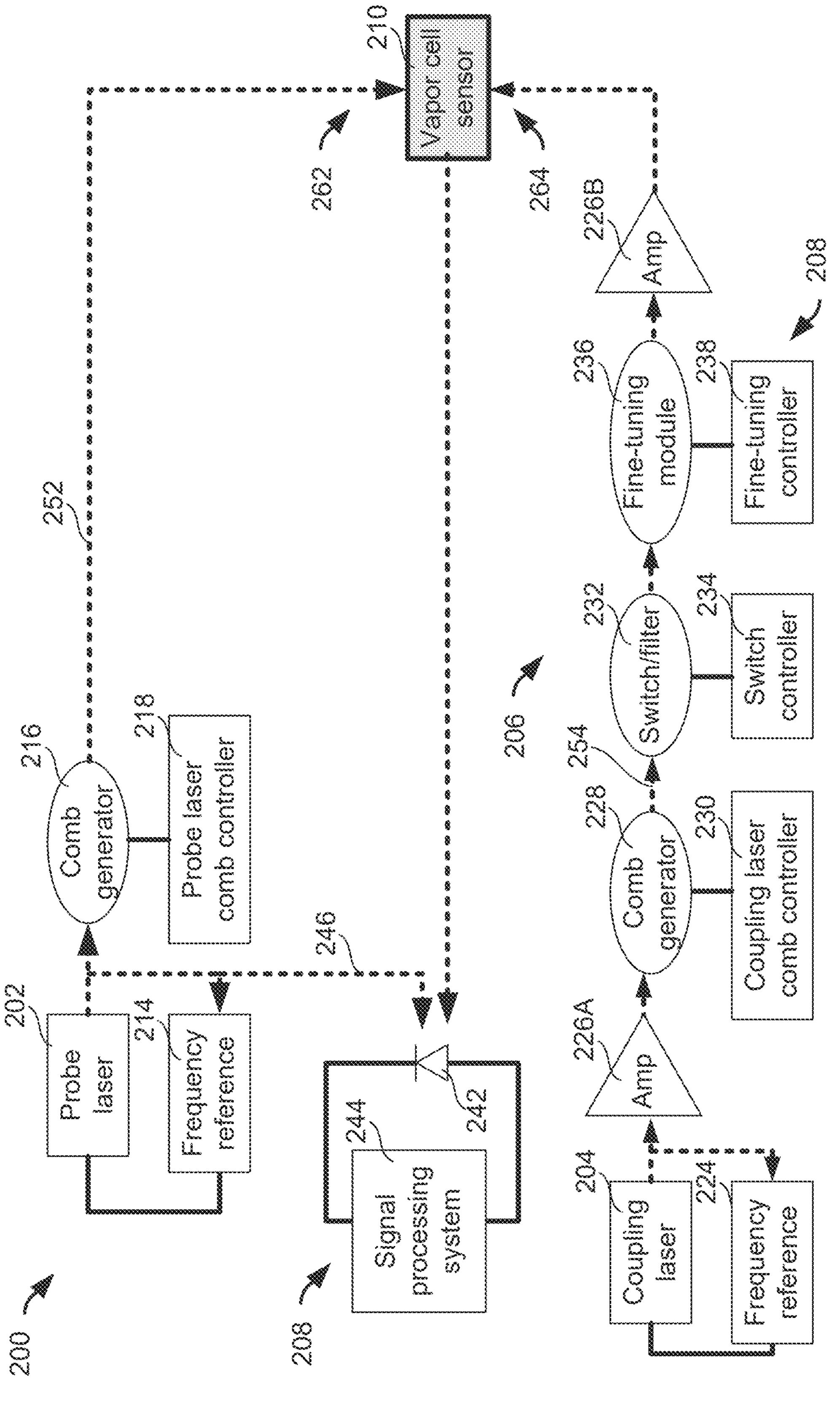
FIG. 2 is a block diagram showing aspects of an example portable QSS system.

FIG. 2 is a bock diagram showing aspects of an example portable QSS system 200. As shown in FIG. 2, the example portable QSS system 200 includes a probe laser 202, a coupling laser 204, a photonic integrated circuit system 206, a system-on-chip 208, and a vapor cell sensor 210. The photonic integrated circuit system 206 of the example portable QSS system 200 includes optical devices and components that are optically coupled to one another via optical pathways (broken lines); and the system-on-chip 208 includes electronic devices and components that are electrically coupled to one another or respective devices or components of the photonic integrated circuit system 206 via electrical pathways (solid lines). In some instances, the lasers 102, 104, the photonic integrated circuit system 206, the system-on-chip 208, and the vapor cell sensor 210 may be implemented as the respective subsystems or components of the example portable QSS system 100 shown in FIG. 1 or in another manner. The portable QSS system 200 may include additional or different features, and the components of the portable QSS system 200 may operate as described with respect to FIG. 2, the operations in the example process 700, 900 in FIGS. 7 and 9, or in another manner. For example, the lasers 202, 204, the photonic integrated system 206, the system-on-chip 208, and other components (e.g., a location detection system, a timer, a wireless communication module, etc.) can be housed in a portable control package (e.g., the portable control package 104 in FIG. 1).

In some implementations, the probe laser 202 of the portable QSS system 200 is a semiconductor laser. In some instances, the probe laser of the portable QSS system 200 can be a narrow bandwidth DFB or DBR laser. In some instances, gain chips can be coupled to the photonic integrated circuit system 206 for feedback. In certain examples, the photonic integrated circuit system 206 and the probe laser 202 can be combined such that laser stabilization and modulation are possible on the same device. For example, a heterogenous photonic integrated circuit system 206 may include lasers, modulators, laser stabilization, line narrowing and routing. The probe laser 202 may include fiber lasers, external cavity lasers, or other types of lasers. In some examples, the cavities can be waveguide cavities such as Bragg reflectors or ring resonators (or series of ring resonators) that can ensure single frequency and single mode operation. In some instances, the probe laser 202 can generate a direct probe laser output signal with a power of about 150 mW and a linewidth in a range of 1-10 kHz. In some instances, the probe laser 202 may generate a direct probe laser output signal with another power and another linewidth. The probe laser 202 does not have to be widely tunable. In some examples, the probe laser 202 may take a volume of 12 cm×12 cm×4 cm or another volume. Narrow bandwidth semiconductor lasers may be ECDLs locked to get very narrow linewidths and stability (low bandwidth feedback loops). In some implementations, the probe laser 202 can be fiber coupled with in-housing isolators. In some instances, the probe laser 202 may be operated at 509 nm or 2.2 μm. When the probe laser 202 operates at 2.2 μm, a narrow bandwidth 636 nm probe laser with a power of about 100 mw may be delivered to the vapor cell sensor 210. These wavelengths are appropriate examples for the Cs atom. Other wavelengths are possible as are other atoms, e.g., Rb, which may require other wavelengths. In some instances, the probe laser 202 may be configured and operated as described in U.S. Pat. No. 11,658,461, or in another manner.

In some implementations, the coupling laser 204 of the portable QSS system 200 is a semiconductor laser. In some instances, the coupling laser 204 of the portable QSS system 200 can be a narrow bandwidth DFB or DBR laser. In some instances, the coupling laser 204 may be implemented as the probe laser 202. In some instances, the coupling laser 204 can generate a coupling laser signal, when monolithic, with a power of greater than 2 W and a linewidth in a range of 1-10 kHz. The coupling laser signal can be widely tunable, e.g., ~5-10 nm or another range. When the coupling laser signal is amplified using a fiber or semiconductor amplifier (e.g., tapered amplifier, semiconductor optical amplifier, etc.), the power to seed the amplifier can be provided, for example, greater than 20 mW. In some instances, the coupling laser signal may be provided with enough power to accommodate a loss in the photonic integrated circuit system 206 to seed an amplifier whose output power is targeted to a particular application, for example, greater than 150 mW. The direct coupling laser output signal generated by the coupling laser 204 can be amplified by the first optical amplifier 226A made of fiber or semiconductor amplifier or another type of amplifier. In some instances, the coupling laser 204 may generate a direct coupling laser output signal with a laser power of another value and a linewidth of another value. In some instances, the volume for this coupling laser 204 and its electronics is 12 cm×12 cm×4 cm or another value.

As shown in FIG. 2, the photonic integrated circuit system 206 includes a first comb generator 216, a second comb generator 228, a first optical amplifier 226A, a second optical amplifier 226B, a switch/filter unit 232, and a fine-tuning module 236. In some instances, the first frequency comb generator 216 may include waveguide electro-optic modulators, on-chip modulators, or another technology. In certain examples, the first frequency comb generator 216 is configured to generate a first frequency comb signal 252 with tooth spacings of kHz-MHz depending on the desired spectral resolution with breadths of up to 1 GHz. In some instances, a waveguide electro-optic modulator can be made from lithium niobite or potassium titanyl phosphate (KTP). In some examples, a waveguide electro-optic modulator may have a volume of 1 cm×1 cm×12 cm. In some instances, the first frequency comb generator 216 based on a chip-scale device may have a volume equal to or less than 1 cm×5 cm×0.5 cm. In some instances, on-chip modulators can be constructed using, for example, thin film lithium niobate (TFLN) on silicon to form waveguides that can be electrically modulated. The first frequency comb signal 252 can be generated at a first output 262 of the photonic integrated circuit 206. In some instances, the probe laser signal or the first frequency comb signal 252 can be amplified by operation of one or more optical amplifiers prior to the first output 262.

In some implementations, the optical amplifiers 226A, 226B of the photonic integrated circuit system 206 are semiconductor amplifiers, namely tapered amplifiers or semiconductor amplifiers. In some instances, the optical amplifiers 226A, 226B may include fiber optic amplifiers, tapered amplifiers, or other types of amplifiers. The optical amplifiers 226A, 226B are high power amplifiers that can output optical signals with a power of greater than 150 mW. The first optical amplifier 226A is configured to boost the power levels of the coupling laser signal in order to compensate for loss in the second comb generator 228, the switch/filter unit 232, or other devices along the optical pathways. In some instances, the optical pathway may include more optical amplifiers at any intermediate stages. The power level of the optical signals can be large enough to seed the second amplifier 226B at a second output 264 of the photonic integrated circuit 206. In certain examples, in response to the output optical signals of the switch/filter unit 232 is greater than 50 mW, the second amplifier 226B may not be required for some applications. In some implementations, the first optical amplifier 226A is a boost amplifier; and the second optical amplifier 226B is a high-power amplifier. In some instances, the semiconductor amplifiers may be the same size as the probe and coupling lasers 202, 204. In some examples, when the second optical amplifier 226B includes a tapered amplifier, the second optical amplifier 226B includes a heat sinking device. In certain examples, the optical amplifiers 226A, 226B can fit into a volume of 12 cm×12 cm×12 cm or another value. In some instances, a semiconductor amplifier (high power) can be operated at either 2.2 micrometers (μm) or 509 nanometers (nm). Higher output power is required when several, or many, vapor cell sensors 210 are used with the portable QSS system 200. To alleviate power requirements, it may be possible to raster scan the coupling laser 204, the probe laser 202, or both, through the vapor cell sensors 210. The raster can be done throughout the array of the vapor cell sensors 210; or can be done through one or more subsets of the vapor cell sensors 210.

In some implementations, the second frequency comb signal 254 is used so that the coupling laser 204 can remain locked to a fixed frequency reference; and generate frequency components for all possible or desired Rydberg transitions. The second frequency comb signal 254 spans in a range of 5-10 nm. In some instances, the second frequency comb signal 254 is constructed so that the comb tooth spacing between frequency components is in a range of 10-30 GHz. In some implementations, the second frequency comb signal 254 includes about 30-90 comb teeth or a number of comb teeth of another value. In some instances, the second comb generator 228 includes an electro-optic modulator, e.g., a waveguide electro-optic modulator made from lithium niobite or potassium titanyl phosphate (KTP), or an on-chip modulator made with lithium niobite on silicon. Other materials such as tantalum pentoxide may also be possible to use. In some examples, the second comb generator 228 may include multiple electro-optic modulators (e.g., 3-5). In some instances, PIC electro-optic modulators could be substantially smaller because the pi phase voltage is expected to be smaller. Examples of comb generators are described in Dixon, et al., "Rydberg-Atom-Based Electrometry Using a Self-Heterodyne Frequency-Comb Readout and Preparation Scheme," Physical Review Applied 19, 034078 (2023); and Liu, et al., "Stable, narrow-linewidth laser system with a broad frequency tunability and a fast-switching time," Optics Letters 49, 399 (2024). Other types of comb generators may be used in some cases.

In some instances, the switch/filter unit 232 of the example portable QSS system 200 includes a network of switches and filters, which may be made of electro-optics, micro-mechanical mirrors, Bragg gratings, or drop-out filters. In some examples, the drop-out filters may include resonant ring resonators that can be tuned so that the desired frequency passes into the resonator and then is out coupled into a separate optical line. These ring resonators can be tuned electrically, thermally, or piezoelectrically. An electro-optic element within the ring resonator is also possible to implement in order to tune the ring resonator. These systems can act as a dispersive element and switch; therefore, they are efficient. Electro-optic switches are made on a photonic integrated circuit so as to make the system compact. If an on-chip electro-optic switch tree is used, a dispersive element to separate the comb teeth may be used. In some instances, separation of the comb teeth can be accomplished by using an arrayed waveguide grating (AWG). The AWG is a waveguide device; can be fiber coupled, and may have a volume of 25 cm×25 cm×5 cm. The electro-optic switch tree can be of similar size. In some instances, a drop-out filter may be the size of one of the electro-optic on-chip modulators. A compact device can also be made by combining an AWG and a set of micro-mechanical mirrors. These devices can disperse light from a single optical channel and recombine it by changing the pointing angle of the micromechanical mirror to direct it to an output fiber. The switch tree can be configured to route optical signals to a single, or multiple, output channels. A high degree of flexibility can be realized by changing the topology of the dispersive and switching systems.

In some implementations, the fine-tuning module 236 of the photonic integrated circuit system 206 includes one or more fine-tuning elements. In some instances, a fine-tuning element may be implemented as a specialized electro-optic modulator, configured as a Mach-Zehnder interferometer, a so called "IQ" modulator. In some implementations, an IQ modulator enables the fine-tuning element to use single side band suppressed carrier modulation to shift the optical frequency from the switch/filter unit 232 to the Rydberg state that is desired. The fine-tuning element works over the comb tooth separation to tune the one or more selected frequency components of the second frequency comb signal 254 across the spectrum continuously. The electro-optic modulator can be a modified version of the ones used in the second comb generator 228. In some instances, the bandwidth of the fine-tuning elements may at least match the comb tooth separation of the second frequency comb signal 254. Multiple fine-tuning elements can be used to shift frequencies of multiple frequency components of the second frequency comb signal 254 which can be used to sense multiple RF frequencies in the electromagnetic radiation using a single or multiple vapor cell sensors 210. Each output configured by the dispersive and switch system can implement a fine-tuning element. The fine-tuning elements can be implemented and then recombined into a single output channel to sense multiple frequencies. The recombination of the light output by the fine-tuning elements can be done using fiber combiners or a photonic integrated circuit.

In some implementations, the vapor cell sensor 210 utilizes the quantum states of Rydberg atoms for absolute measurement of electromagnetic radiation. The vapor cell sensor 210 can be self-calibrated. In some instances, the vapor cell sensor 210 can be implemented with a wide carrier bandwidth so that the vapor cell sensor 210 does not need to be changed in order to detect the electromagnetic radiation. In some aspects of operation, RF radiation or other electromagnetic radiation is received by the vapor cell sensor 210, and the RF radiation passes through a window (e.g., formed of the dielectric material) of the vapor cell to interact with the vapor residing in the vapor cell. During such interaction, input optical signals at the first and second ports 262, 264 can be communicated to the vapor cell sensor 210. In some instances, the vapor cell sensor 210 can generate output optical signals based on the interaction between the input optical signals, the vapor and the electromagnetic radiation in the vapor cell. In some instances, the vapor cell sensor 210 may be implemented as the vapor cell sensor 102 in the example portable QSS system 100 shown in FIG. 1 or in another manner.

In some instances, an optical detector 242 of the example portable QSS system 200 can be a photomultiplier tube, an avalanche photodiode, a conventional photodiode, or other types of optical detectors. For the comb readout, the first frequency comb signal 252 passing through the vapor cell sensor 210 is combined with a reference signal 246 from the probe laser 202 to generate beat signals between the comb teeth and reference. These beat signals represent the optical signal that is transmitted at each tooth frequency. In other words, all the teeth can be measured at the same time by analyzing the spectrum using the system-on-chip 208. The electrical signal generated by the optical detector 242 can be amplified using a low noise amplifier. The bandwidth of the signal processing system 244 may match the comb bandwidth, up to about 1 GHz. In some instances, the optical detector 242 and the signal processing system 244 of the system-on-chip 208 can be fitted into a volume of equal to or smaller than 12 cm×12 cm×12 cm. In some instances, the example portable QSS system 200 includes multiple optical detectors 242 for respective vapor cell sensors 210. For example, each vapor cell sensor 210 may require a corresponding optical detector 242.

In some instances, the system-on-chip 208 includes digital control systems which can include a hybrid FPGA, GPU, computer processor board such as a Xilinx Ultra-scale board, or other types of boards. A digital control system may have a board and a dedicated computer processor. The digital control systems are configured to perform signal processing and control other components of the example portable QSS system 200, both automatically and in response to an instruction from the user. The digital control systems can also host the user interface and pass user information to the user through a screen or interface, such as a LAN connection. The digital control systems can also communicate information if connected to a network via wired or radio communications system to non-local users. In some implementations, the size of the board of the digital control systems is that of a typical computer mother board. In response to the portable QSS system being used as a central computer system of a QSS network, the digital control system can be configured to receive, process and fuse data received from other portable QSS systems within the network. In some instances, processing data for analysis can be done in part or entirety in the portable QSS system 200. Data may also be processed in part or in whole at a data fusion center, e.g., command and control center. The data fusion center can send the processed data back to the portable QSS systems 200 within the network to provide information reflective of the entire network, or some subset of the network. The data can be communicated in part or in whole to the nodes of the system. The data communicated to the data fusion center can be RF spectral data, timing data, and geolocation data, or some combination of these. The data communicated to the QSS system 200 can be information such as topographical corrections (e.g., areas that are obscured by topographical features to be identified, and compensated or corrected for) signals data, and RF frequency ranges of interest, amongst other derived quantities.

Figure 4:
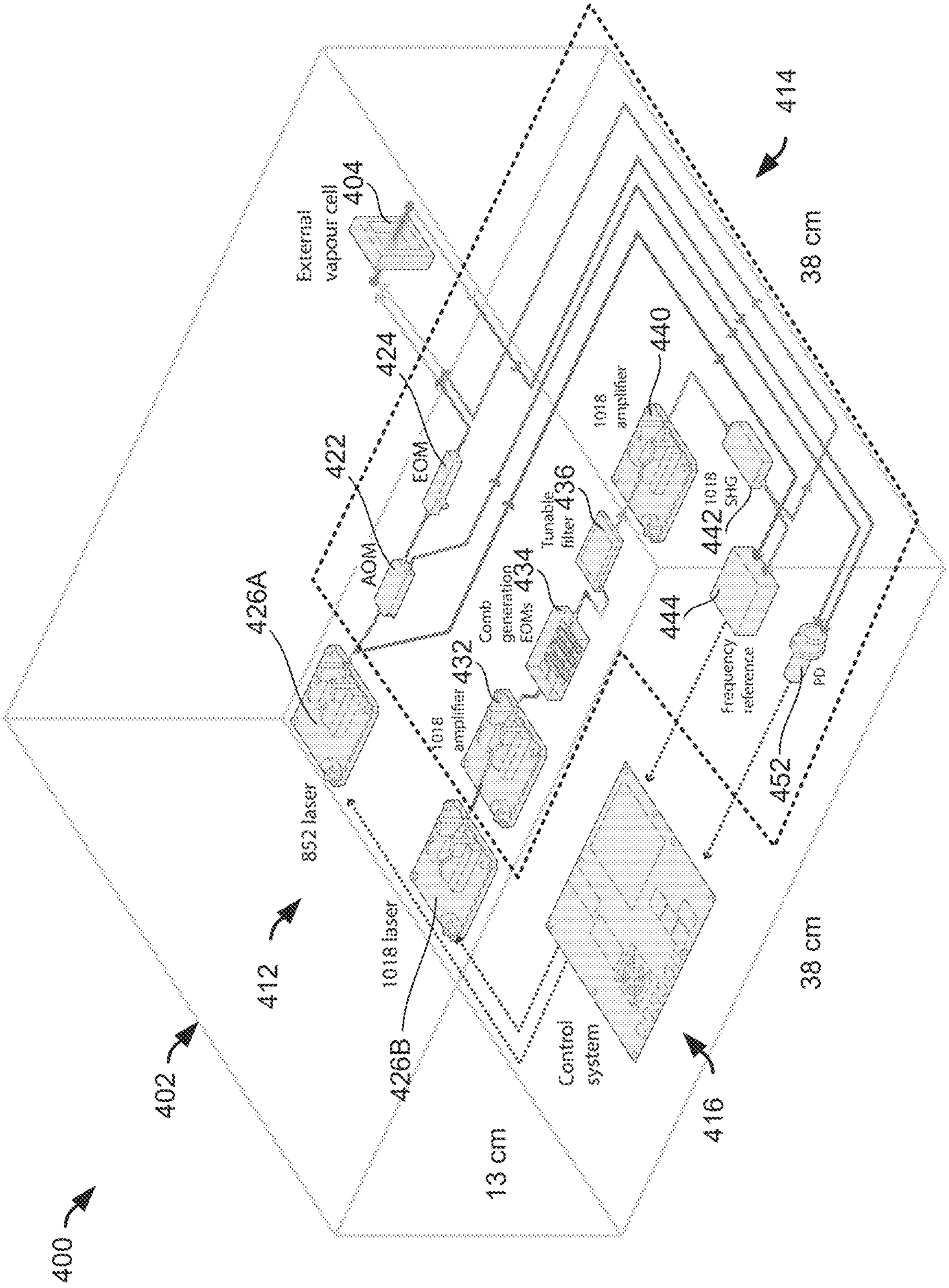
FIG. 4 is a schematic diagram showing aspects of an example portable QSS system.
Figure 5A:
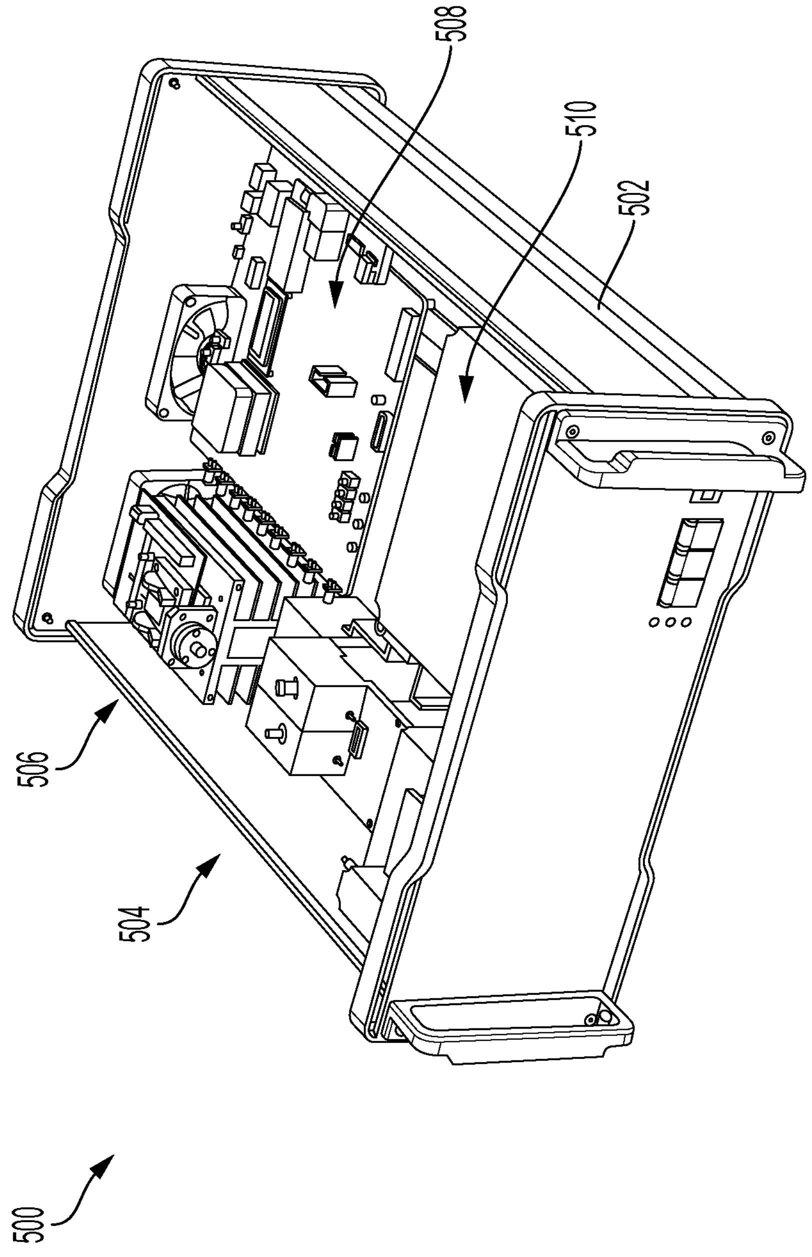
FIGS. 5A-5B are renderings of a portable control package of an example portable QSS system.
Figure 5B:
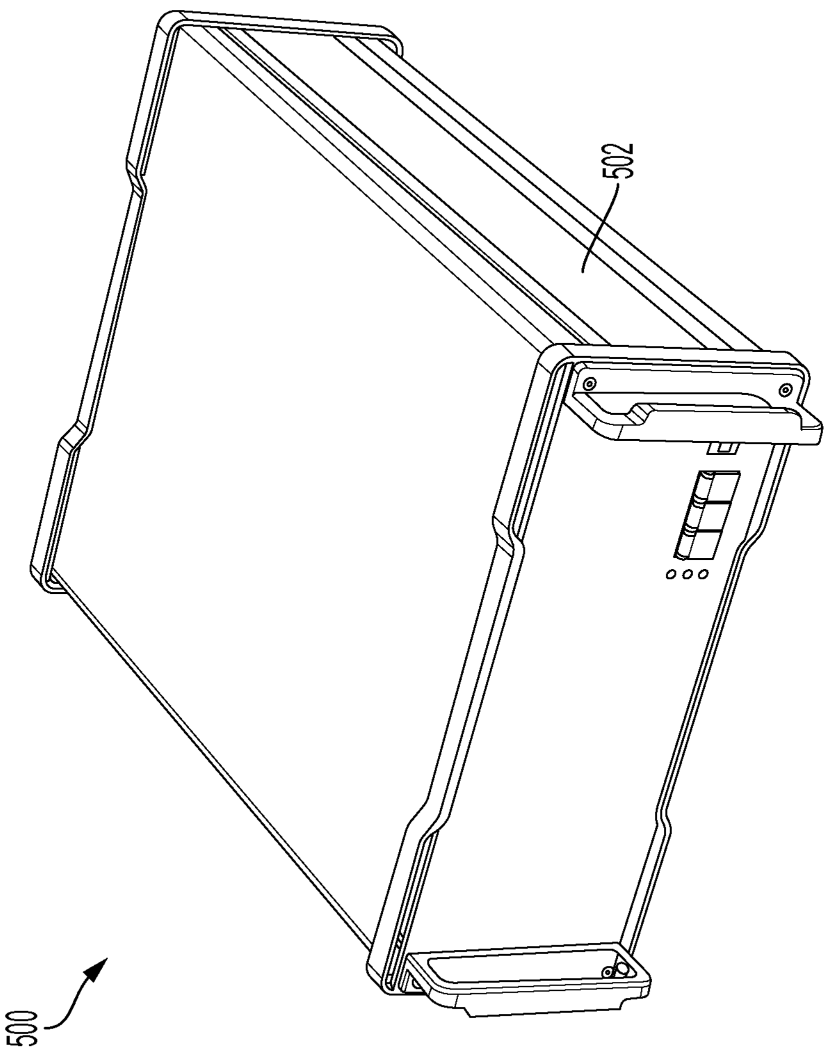

In some implementations, at least some of the optical components and subsystems in the photonic integrated circuit system 206 can be connected via an optical waveguide, e.g., fiber optics, or optical micro-bench technology. In some instances, at least some of the components of the example portable QSS system 200 can be sealed and electrically connected with MIL-STD-180 connectors and headers. In some instances, the example portable QSS system 200 may have a volume of 38 cm×38 cm×18 cm as shown in FIG. 4. In some instances, an example portable QSS system 200 may have a volume of 49 cm×38 cm×13 cm as shown in FIGS. 5A-5B.

In some instances, the example portable QSS system 200 may be operated under different modes, e.g., a slow scan mode during which sweeping the laser is performed or a time-dependent signal acquisition mode during which the comb signal can be acquired at each frequency as a function of time. In some examples, the example portable QSS system 200 may be operated and switched from one mode to another in an automatic fashion by adjusting the parameters of the lasers 202, 204, the photonic integrated circuit system 206, the signal processing system 244, or other devices and components. For example, the example portable QSS system 200 can be configured to perform slow scanning RTSA at fixed frequency band in which no agile laser (e.g., no frequency comb generator) is used, and changing the frequency of the laser signal of the coupling laser can be performed by relocking; and may switch to the rapid scanning mode in which the agile laser (e.g., the frequency comb generator) is used. In some implementations, the methods and systems presented here allow simultaneous generation of multiple frequency components from the second frequency comb signal which can be routed to the same vapor cell sensor 210 or different vapor cell sensors 210 so as to sense multiple RF frequencies at the same time. The methods and systems presented here allow the portable QSS system 200 to be reconfigured in order to adapt to a particular task. For example, the example portable QSS system 200 can be configured to first perform surveying (e.g., fast scanning) to identify areas and signals of interest. Once the areas of interest are identified, the example portable QSS system 200 can be reconfigured to perform data collection on the identified areas of interest, for example, with longer dwell time or to perform data collection on the identified signals of interest in real-time. In some instances, the collected data can be locally processed to determine properties of the electromagnetic radiation; or can be transmitted to a central computer center where it can be processed to determine the properties of the electromagnetic radiation. In some instances, upon determining the properties of the electromagnetic radiation, the central computer center may communicate information back to the portable QSS system 200. The information may include the determined properties of the electromagnetic radiation based on the collected data, actions needed in response to the determined properties, and other information. In some instances, the action may include instructions to reconfigure the parameters of the spectrum sensing according to specific features in the determined properties, the parameters of data processing, and other parameters.

Figure 6A:
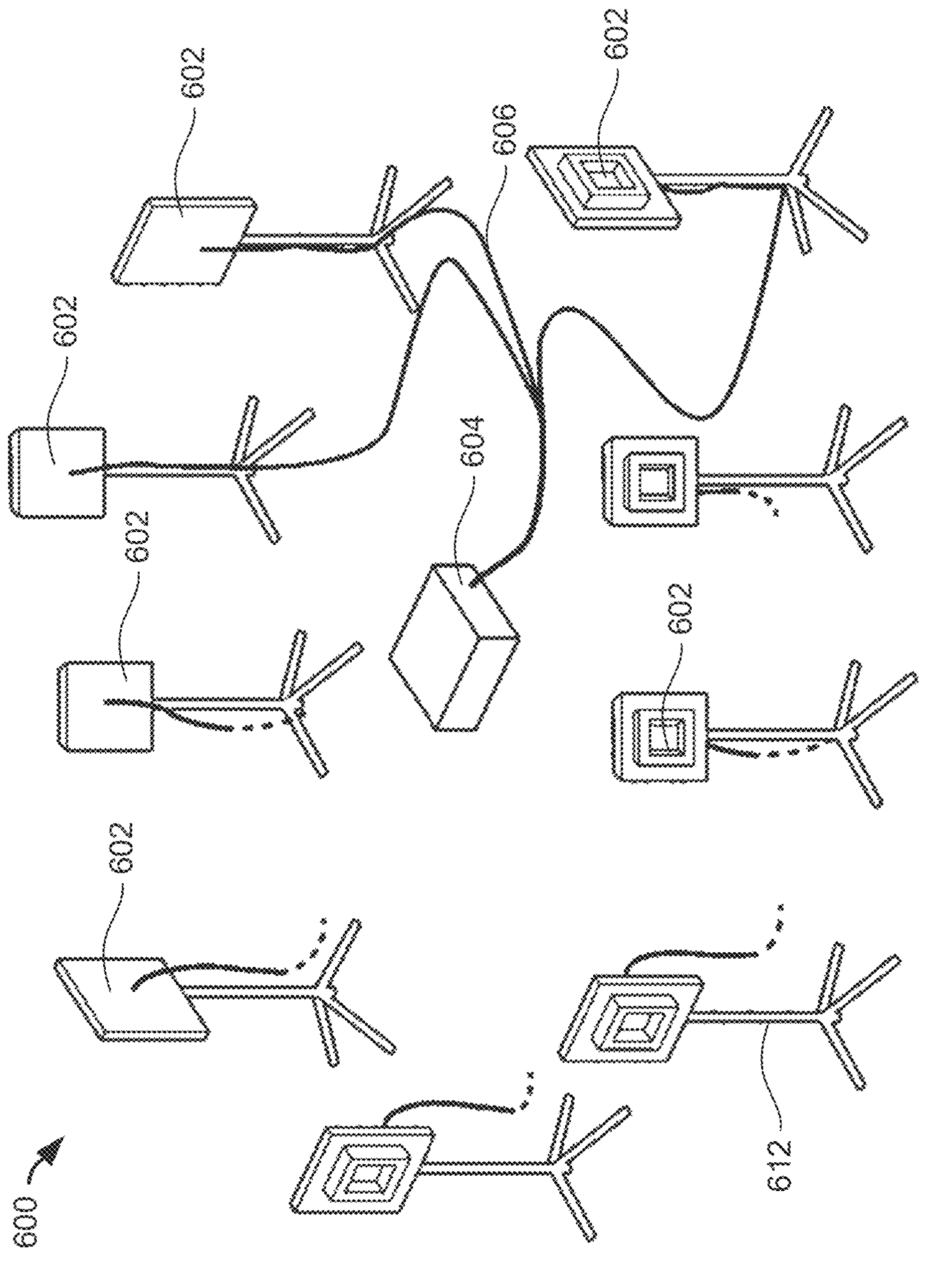
FIGS. 6A-6B are schematic diagrams showing aspects of example portable QSS systems with arrays of vapor cell sensors.

In some instances, the vapor cell sensors 210 of the example portable QSS system 200 are omnidirectional; and have wide bandwidth. In some instances, the vapor cell sensors 210 may include narrow bandwidth vapor cell sensors, e.g., photonic crystal receivers, or other types of vapor cell sensors. The vapor cell sensors 210 or a subset of the vapor cell sensors 210 may be configured as an array for sensing different RF frequencies, for determining angle of arrival, or for other applications. In some instances, the vapor cell sensors 210 may include collection and focusing elements such as lenses. The vapor cell sensors 210 can be passive sensors. Some example configurations of vapor cell arrays are shown in FIG. 6A (e.g., for scanning a large area) and 6B (for scanning a small area). These arrays can be reconfigured by the user. For example, the vapor cell sensors may be assembled and supported on a support template; and disassembled when need to be reconfigured. In some instances, the vapor cell sensor 210 may be implemented as the vapor cell sensor 102 in the example portable QSS system 100 shown in FIG. 1 or in another manner.

In some implementations, the example portable QSS system 200 includes a location detection system. In some instances, a location detection system may be used to assist the portable QSS system 200 to generate geolocation data which can be associated with the vapor cell sensors 210 of the portable QSS system 200, the determined properties of the electromagnetic radiation, or other data. For example, a handheld GPS receiver can be used to input the positions of the vapor cell sensors 210 into the portable control package so that the relative distances and positions of the vapor cell sensors are known. In some implementations, the example portable QSS system 200 includes a clock configured to generate timing data which can be associated with the vapor cell sensors where the output optical signals are received, the determined properties of the electromagnetic radiation, or other data. In some instances, the clock may be implemented as the clock 126 in the example portable QSS system 100 in FIG. 1.

For electronic warfare spectrum sensing, portable QSS systems can examine the signal coming into the RTSA band of ~250 MHz in real-time. For example, the signals corresponding to different RF frequencies can be sensed via EIT at each probe comb tooth frequency, or combinations of the probe laser comb teeth. Each tooth can be monitored in time in order to detect time dependent signals, extending the bandwidth of the vapor cell sensors. In some instances, the portable QSS system 200 can be used to detect and analyze pulsed radar or other wireless communications signals.

In some instances, the example portable QSS system 200 can be used to reveal the utilization of the frequency spectrum by enabling the performance of an ultra-broadband scan without changing equipment while allowing specific regions of the spectrum where signals are found (such as pulsed waveform details) to be monitored in real-time. Spectral surveying is an essential precondition for proper spectrum monitoring and allocation. The portable QSS system 200 makes planning and assigning frequencies easier by identifying the "white spaces" in the spectrum. Measurements validate assigned frequency utilization in specific areas and provide information about possible re-use of frequencies, which enables more precise channel assignment, ensuring reliable radio communications free from interference.

When several users heavily occupy a small range of frequencies or fill up entire frequency bands, they can cause RF interference. Blocked or dropped calls interrupt information flows. This is an annoyance during commercial usage, but it can lead to tactical disadvantages during real world military operations. The opposite is true for unused or rarely occupied frequencies: they can offer the advantage of an available, un-jammed spectrum. In some instances, portable QSS systems 200 can be used to perform coverage verification. When assigning frequencies or planning missions, spectrum managers may be aware of the radio coverage of each transmitter to ensure gapless signal reception and avoid conflicts with other transmitters on the same frequencies in the field. Computer simulations can provide an initial assessment, but cannot reveal actual coverage and spectrum usage, especially when geography and weather play a role.

In some instances, portable QSS systems 200 may enable spectrum managers to measure actual propagation ranges. In some implementations, the portable QSS system 200 can be configured to measure communications links in specific areas. Results from such measurements can provide indications of potentially reusable frequencies at remote sites. In operational areas, coverage measurements can even check whether adversaries can detect friendly radio communications.

Friendly forces actively use the electromagnetic spectrum for RF communications, navigation, targeting and many other applications. In doing so, they emit electromagnetic waves that can be intercepted and exploited by adversaries. Intercepted emissions can reveal the locations of friendly forces, their intentions and other essential elements of friendly information, putting the mission at risk. Close consideration of unavoidable transmissions and issuing proper emissions control (EMCON) orders are paramount. In some instances, portable QSS systems 200 can deliver reliable information about emissions control (EMCON) discipline by detecting and locating each emission within a defined area. Commanders can ensure that troops are complying with their EMCON orders during exercises and operations. This helps forces to remain undetected by adversaries and reliably accomplish their missions.

In some instances, portable QSS systems 200 may have the benefits of being a versatile tool for efficient field operations. Portable QSS systems 200 can be the tool of choice for a diverse set of measurements, including coverage management, occupancy analysis, and many other tasks. Lightweight, battery-powered, rapidly deployable to any site, the system can be controlled directly or autonomously for 24/7 operations. Minimal infrastructure, simple setup, compact and light-weight design, and highly flexible and agile configurability are some of its advantages. Because the signals are transported to the signal processing system optically and it is broadband, it is easier to use than a conventional RF system over the same bandwidth range, enabling a soldier to have minimal training to use the device effectively.

Figure 3:
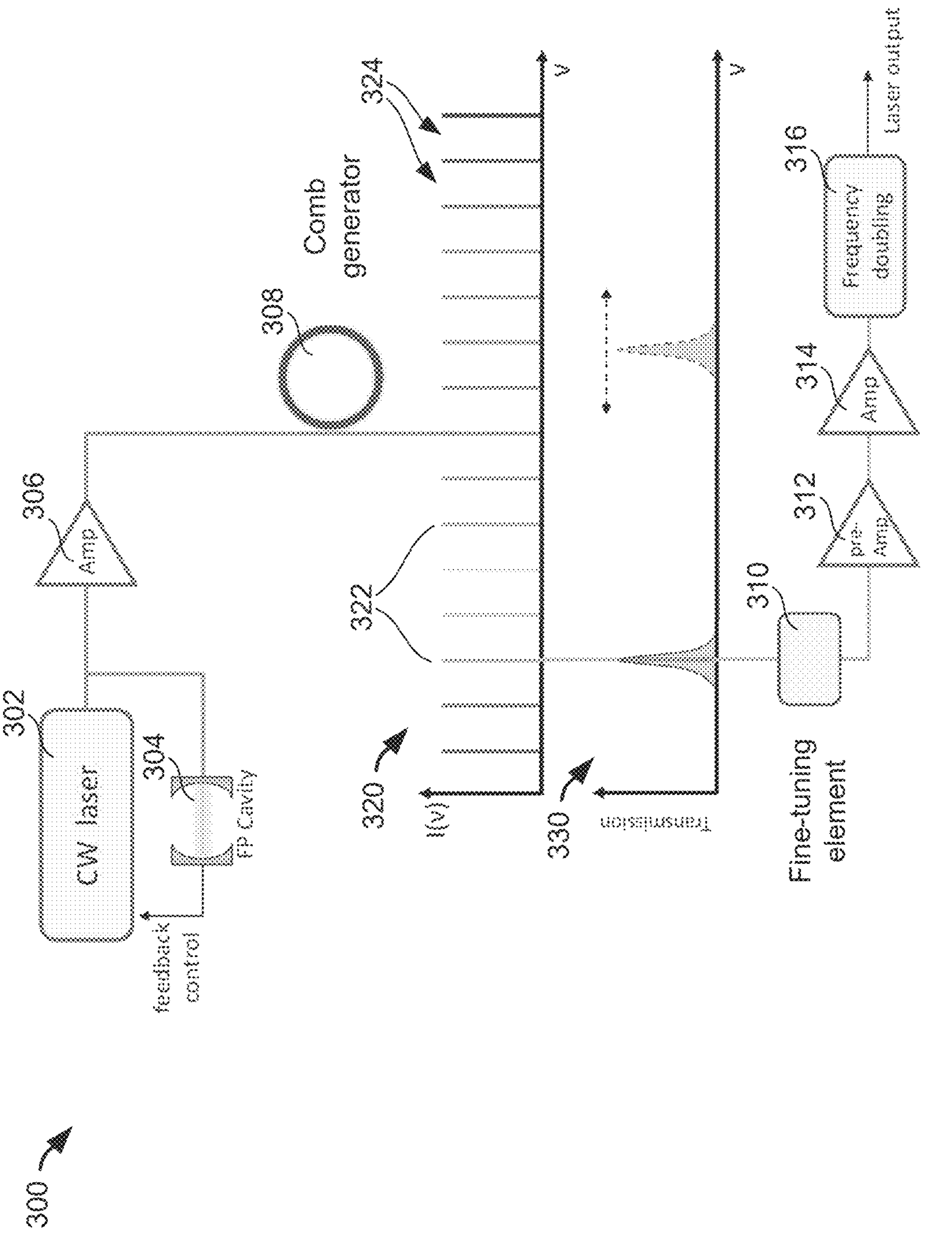
FIG. 3 includes a block diagram of a portable control package of the portable QSS system shown in FIG. 1.

FIG. 3 is a schematic diagram showing aspects of an example portable control package 300 of a portable QSS system. As shown in FIG. 3, the portable control package 300 includes a continuous wave (CW) laser 302 having a narrow linewidth. The CW laser 302 is actively locked to a frequency reference provided by a Fabry-Perot (FP) cavity 304. Moreover, the frequency (or wavelength) of the CW laser 302 is fixed at a single value that, in many instances, does not change appreciably. In some instances, the CW laser 302 may include a semiconductor laser, a solid-state laser, and a fiber laser. The FP cavity 304 is configured to provide an optical signal (e.g., a frequency reference) whose frequency is defined by a precise value. With modulation of the CW laser 302 around the reference frequency of the FP cavity 304, a feedback signal can be generated to stabilize the frequency of the CW laser 302 to the reference frequency. The portable control package 300 includes an optical amplifier 306 which can be used if the output power of the CW laser 302 is too low to generate sufficient optical power in selected one or more comb lines in a later process or if additional optical power is needed to lock the CW laser 302 to the frequency reference of the FP cavity 304.

During operation, the CW laser 302 may be kept locked to the frequency reference. Such locking can eliminate the process of wavelength tuning at the CW laser 302 and may also eliminate the relocking process. The frequency comb signal can be generated across a few tens to a few hundred nanometers, which is far beyond the mode-hop-free tuning range of an ECDL. Alternatively, the CW laser 302 may be stabilized by locking one of the comb teeth to the frequency reference, instead of the direct output of the CW laser. This type of locking expands the allowable wavelength range if no frequency reference exists that is close to the center of the desired wavelength range.

As shown in FIG. 3, the example portable control package 300 also includes a comb generator 308. The direct laser output signal of the CW laser 302 or the amplified laser signal (e.g., after the optical amplifier 306) can be used to generate a frequency comb signal across a target wavelength spectrum with a comb tooth spacing of a few tens of GHz. In some instances, the comb tooth spacing may be less than or greater than this number. However, in many applications, it is beneficial to make the comb tooth spacing as large as possible (accounting for the availability of RF devices) to cover a wide spectral range. In some instances, the comb tooth spacing may have an upper limit set by the capability of a fine-tuning element (e.g., the fine-tuning element 310) to continuously cover the spectral range between the comb teeth. FIG. 3 shows an example frequency comb signal 320 from the comb generator 308 showing fifteen comb teeth 322 with a comb tooth spacing 324 between two neighboring comb teeth 322. In some examples, the comb generator is a micro-resonator; and the frequency comb signal (Kerr frequency comb) is generated through four-wave-mixing in the micro-resonator.

The example portable control package 300 includes a frequency filter. The frequency filter is configured to select one or more comb teeth (e.g., one or more frequency components) from the multiple frequency components of the frequency comb signal. In certain cases, the output of the frequency comb signal is filtered so that only one comb tooth closest to the target frequency is output from the frequency filter. In cases where more than one frequency component is required, the frequency filter can be used to select a subset of comb teeth that are recombined at its output. Thermal or piezo-electrically tuned fiber Bragg gratings or ring resonators may be used as optical bandpass filters to select the target comb tooth. In some instances, the frequency filter can include an arrayed waveguide grating (AWG) optically coupled to an optical switch. The comb teeth of the frequency comb are diffracted into individual optical channels through the arrayed waveguide grating, and the optical switch can be configured to select an optical channel closest to the target frequency. FIG. 3 shows an example transmission spectrum 330 generated by operation of the frequency filter based on the received frequency comb signal 320.

As shown in FIG. 3, the example portable control package 300 also includes a fine-tuning element 310. The fine-tuning element 310 is a frequency shifter configured to shift one or more frequencies of the one or more selected frequency components to one or more targeted frequency values. For example, the fine-tuning element 310 may be a high-speed electro-optic modulator which can be configured to fine tune and quickly shift the frequency of a selected frequency component to a target frequency value. Such shifting may also include scanning the selected comb tooth within a spectral bandwidth around the target frequency. Moreover, single sideband suppressed carrier (SSB-SC) modulation can be used so that a single frequency is output. In this case, the fine-tuning element 310 may be a Mach-Zehnder type modulator, a high bandwidth lithium niobate waveguide modulator, or another type of modulator. The fine-tuning element 310 can, for example, fine-tune the output by one full comb spacing (or ± one half a comb spacing). In some instances, the fine-tuning element 310 may include other types of devices.

As shown in FIG. 3, the example portable control package 300 includes optical amplifiers 312, 314 which are used to amplify the power of the one or more selected frequency components. The first amplifier 312 amplifies a small signal to a level where the second amplifier 314 can operate. In some instances, such configuration can minimize, limit or otherwise reduce amplified spontaneous emission (e.g., incoherent light emitted in the amplification process).

FIG. 4 is a block diagram showing aspects of an example portable QSS system 400. As shown in FIG. 4, the example portable QSS system 400 includes a portable control package 402 and a vapor cell sensor 404 residing outside of the portable control package 402. In some instances, the portable control package 402 and the vapor cell sensor 404 of the portable QSS system 400 may be implemented as respective components of the portable QSS system 100, 200, or in another manner. In some instances, the portable QSS system 400 may be operated according to the operations in the example process 700, 900 in FIGS. 7 and 9, or in another manner.

As shown in FIG. 4, the portable control package 402 includes a laser system 412, a photonic integrated circuit system 414, and a system-on-chip 416. The laser system 412 includes a probe laser 426A (e.g., 852 nm laser) and a coupling laser 426B (e.g., 1018 nm laser). In some implementations, the photonic integrated circuit system 414 includes optical components and devices that are connected to the probe laser 426A and coupling laser 426B for processing a direct probe laser output signal and a direct coupling laser output signal. In particular, the photonic integrated circuit system 414 includes an acousto-optic modulator (AOM) 422 and a first electro-optic modulator (EOM) 424 coupled to the probe laser 426A through the AOM 422. The photonic integrated circuit system 414 includes a first optical amplifier 432, a second EOM 434, a tunable filter 436, a third EOM, a second optical amplifier 440, a second harmonic generator (SHG) 442, a frequency reference 444, and an optical detector 452.

In some instances, the probe lasers 426A is a semiconductor laser; and may be implemented as the probe laser 202 in FIG. 2. The AOM 422 is configured to receive the direct probe laser output signal from the probe laser 212; and split the probe laser signal 226 into two portions. In some instances, the probe laser 426A may be locked to respective reference frequencies. In some instances, the AOM 422 can be configured to cause a shift of the frequency of a first portion of the direct probe laser output signal to a value different from (e.g., higher or lower than) the frequency of the second portion. The first portion of the direct probe laser output signal can be used as a frequency reference signal for the frequency reference 444; and the second portion of the direct probe laser output signal can be received by the first EOM 424. In some implementations, the first EOM 424 is a first frequency comb generator configured to generate a first frequency comb signal including multiple frequency components with respective comb frequencies based on the second portion of the direct probe laser output signal. In some instances, the first EOM 424 may be implemented as the first comb generator 216 in FIG. 2.

In some instances, the coupling laser 426B is a semiconductor laser; and may be implemented as the coupling laser 204, 302 shown in FIGS. 2-3. The first and second optical amplifiers 432, 440 may be implemented as the respective optical amplifiers 226A, 226B, 306, 314 in FIGS. 2, 3. The amplified coupling laser signal can be received by the second EOM 434. The second EOM 434 is a second frequency comb generator configured to generate a second frequency comb signal including multiple frequency components with respective comb frequencies based on the amplified coupling laser. In some instances, the second EOM 434 may be implemented as the second comb generator 228 in FIG. 2.

In some implementations, the tunable filter 436 can receive the second frequency comb signal from the second EOM 434 and select one or more frequency components from the second frequency comb signal. In some instances, the tunable filter 436 may be implemented as the switch/filter unit 232 in FIG. 2. The one or more selected frequency components are then communicated to a third EOM in the tunable filter 436, where the frequencies of the one or more selected frequency components are shifted toward target frequency values. In some instances, the third EOM is a fine-tuning element configured to perform frequency shifting on the one or more selected frequency components. In some instances, the third EOM may be implemented as the fine-tuning module 236, 310 shown in FIGS. 2-3.

As shown in FIG. 4, the one or more selected frequency components can be further amplified by operation of the optical amplifier 440. In some implementations, the one or more amplified frequency components are received at the second harmonic generator 442 which is configured to convert the frequencies of the one or more amplified frequency components to twice of the respective frequencies. In some instances, the SHG 442 may include a crystal SHG, a quasi-phase-matched SHG, a waveguide-based SHG, a resonant cavity SHG, a microstructure fiber SHG, a thin film SHG, a surface and interface SHG, or another type of SHG. As shown in FIG. 4, the amplified direct coupling laser output signal can be split by operation of the SHG 442. In some instances, the SHG 442 may be included in an amplifier cavity, e.g., intracavity doubling configuration. One portion of the output of the SHG 442 can serve as a frequency reference to the control system 416 for heterodyne readout. The other portion can be communicated to the vapor cell sensor 404. In some implementations, the SHG 442 is configured to perform a process of doubling the frequency of the one or more selected frequency components of the second frequency comb signal. In some instances, the SHG 442 may reside at a different location. For example, the SHG 442 may be connected after the amplifier 432 and the second comb generator 434. In this case, a portion of the SHG 442 can be routed to the control system as a frequency reference; and another portion can be directed to the second comb generator to generate the second frequency comb signal. In some instances, the SHG 442 may be connected to other components of the photonic integrated circuit system 414 in another manner. In some instances, when a different second laser is used, the SHG 442 may be optional. For example, when the second laser is a laser that generates a laser signal with a wavelength of 509 nm.

In some contexts, the components are typically connected with optical fiber. By making each sub-system independent, the parts can be replaced, and each can be optimized for its application. For example, it is possible to put the electro-optic modulators and the photonic integrated filters on the same chip, however it is advantageous to make these separate systems so that field replacements are possible for one, rather than both. If the costing of the joint chip is reduced enough, then both can be placed on the same chip. Variants of the sub-systems such as the example described can be realized.

FIGS. 5A-5B are schematic diagrams showing aspects of a portable control package 500 of an example portable QSS system. As shown in FIGS. 5A-5B, the portable control package includes lasers 510, a photonic integrated circuit system 506, a system-on-chip 504, 508, a power supply, user interfaces, etc. The portable control package includes a housing 502 that houses all the devices and components. The devices and components may be fabricated and assembled on one or more circuit boards. In some instances, the portable control package 500 may be implemented as the portable control package 104 show in FIG. 1 and the devices and components of the portable control package 500 may be implemented as corresponding devices and components in the example QSS system 200, 400 shown in FIGS. 2 and 4. The portable control package 500 is lightweighted, compact, and portable; and can be carried in a carrying bag, box or another container.

In some instances, the portable QSS system reduction in SWAP-C may be enabled by technologies including photonic integrated circuits (PICs), consolidated-FPGA-matched-filtering (SoC), semiconductor-lasers, tapered-amplifiers, semiconductor-amplifiers, on-chip electrooptic modulators (such as those constructed on thin film $LiNbO_3$-TFLN), and other technologies. The subsystems can be hardened for shock, temperature, vibration, humidity, salt, and fog by hermetically sealing each sub-component and connecting the components via hardened wiring and optical waveguides. Active control systems utilizing feedback and systems using feedforwards can be implemented.

Figure 6B:
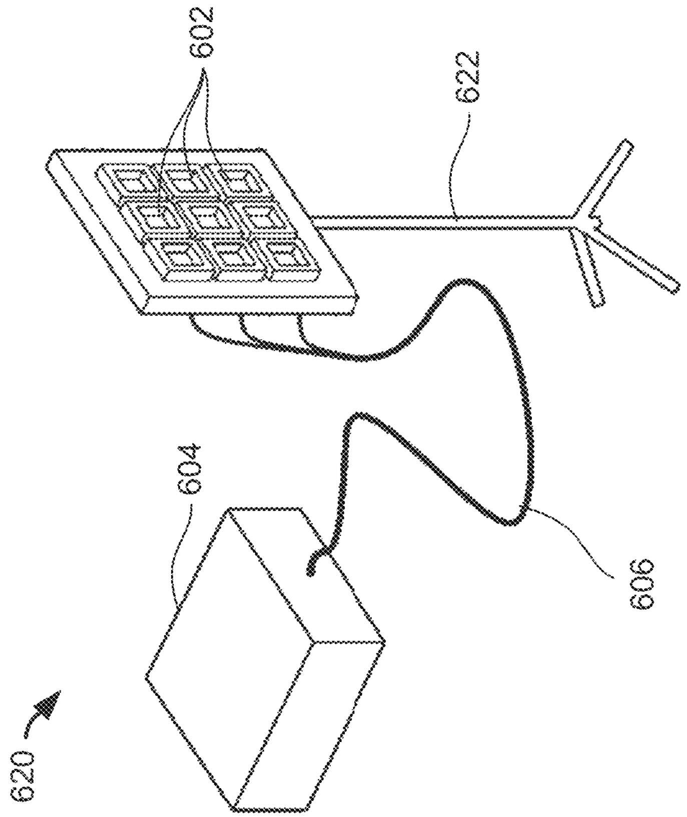

FIG. 6A-6B are schematic diagrams showing aspects of example portable QSS systems 600, 620. In some instances, each portable QSS system 600, 620 includes multiple vapor cell sensors 602 and a portable control package 604 communicably connected to the multiple vapor cell sensors 602 via respective transmission links 606. In some instances, the transmission links 606 includes one or more optical fibers. In some instances, each portable QSS system 600, 620 may be implemented as the portable QSS system 100, 200, 400, 500 or in another manner. In some instances, each portable QSS system 600, 620 may be operated according to the operations in the example process 700 or in another manner.

As shown in FIG. 6A, the multiple vapor cell sensors 602 in the example portable QSS system 600 are individually fixed to respective supports 612, like a tripod, for supporting the vapor cell sensor 602 and its associated optical components (e.g., waveguides, optical connectors, etc.). The multiple vapor cell sensors 602 in the example portable QSS system 600 reside at different geolocations and are orient along different directions. In some instances, the multiple vapor cell sensors 602 may be configured in a topology shown in FIG. 6A or in another manner. As shown in FIG. 6B, the multiple vapor cell sensors 602 in the example portable QSS system 620 are fixed to a common support 622, which is configured to support the multiple vapor cell sensors 602. The multiple vapor cell sensors 602 in the example portable QSS system 620 reside at the same location and are orient along the same direction. In some instances, the multiple vapor cell sensors 602 may be configured in the two-dimensional array shown in FIG. 6B or in any other one-dimensional, two-dimensional, or three-dimensional arrays.

Figure 7:
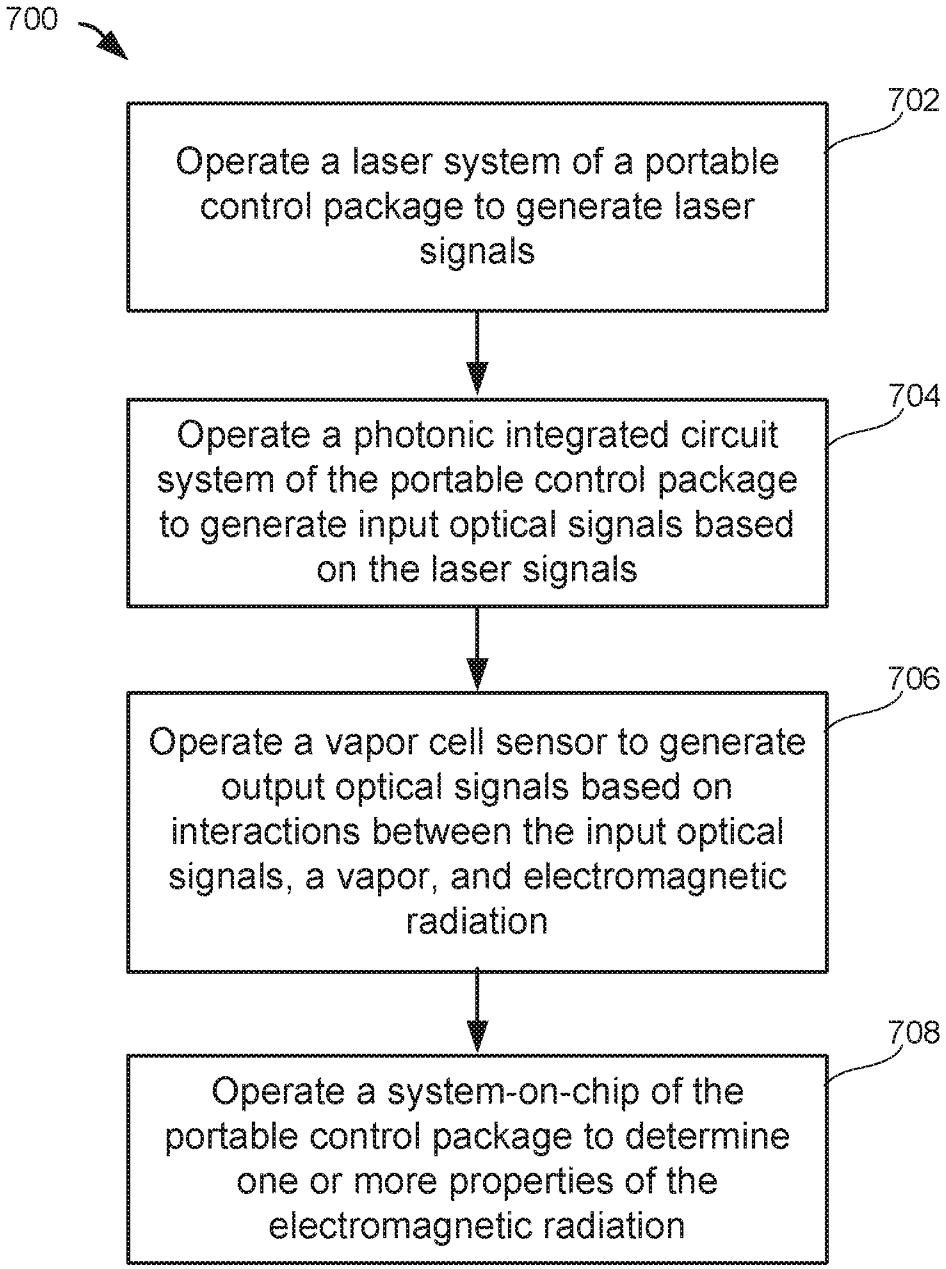
FIG. 7 is a flow chart showing aspects of an example process.

FIG. 7 is a flow chart showing aspects of an example process 700. In some instances, the example process 700 can be operated to characterize electromagnetic radiation in the field generated in a wireless communication network, in an electronic warfare environment, or in another application. The example process 700 may be performed by operations of a portable QSS system. The portable QSS system includes a portable control package and one or more vapor cell sensors each containing a vapor. The portable control package includes a laser system, a photonic integrated circuit system, and a system-on-chip. The portable QSS system may be implemented as the portable QSS system 100, 200, 400, 500, 600, 620 shown in FIGS. 1-2, 4-6B or another portable QSS system. The portable control package is light-weighted, compact, and portable; and can be battery powered and carried by a technician or a soldier to perform measurements in the field. The laser system includes a probe laser configured to generate a probe laser signal, and a coupling laser configured to generate a probe laser signal. The portable control package is configured to generate input optical signals based on the probe and coupling laser signals; guide the input optical signals to the vapor cell sensor; collect output optical signals from the vapor cell sensor; and determine one or more properties of electromagnetic radiation interacting with the input optical signals and the vapor.

At 702, laser signals are generated. In some implementations, two or more direct laser output signals are generated by operation of the laser system of the portable control package of the portable QSS system (e.g., the laser system 112 of the portable control package 104 in FIG. 1). In some implementations, the laser signals include a probe laser signal generated by operation of a probe laser (e.g., the probe laser 202) and a coupling laser signal generated by operation of a coupling laser (e.g., the coupling laser 204, the CW laser 302, or the coupling laser 426B in FIGS. 2-4).

At 704, input optical signals to the vapor cell sensor are generated. In some implementations, the input optical signals are generated by operation of the photonic integrated circuit system of the portable control package of the portable QSS system (e.g., the photonic integrated circuit system 114 of the portable control package 104 in FIG. 1). In some implementations, the photonic integrated circuit system includes optical components and devices configured to communicate and process the direct laser output signals generated by the laser system; and generating the input optical signals to the vapor cell sensor. For example, the photonic integrated circuit system may be implemented as the photonic integrated circuit system 206, 414 in the example portable QSS system 200, 400 shown in FIGS. 2 and 4 or in another manner. For example, the photonic integrated circuit system can be operated to generate a first frequency comb signal based on the probe laser signal; and a second frequency comb signal based on the coupling laser signal. In some instances, the second frequency comb signal can be processed by operation of the photonic integrated circuit system to be amplified. The amplified second frequency comb signal can be further processed such that one or more frequency components of the second frequency comb signal can be selected. The selected frequency components can be further fine-tuned, e.g., adjusting their frequency values. The fine-tuned frequency components of the second frequency comb signal and the first frequency comb signal are the input optical signals to the vapor cell sensor. In some implementations, the optical components and devices of the photonic integrated circuit system are controlled by the system-on-chip which can generate electrical control signals for the respective components and devices. In some instances, the system-on-chip can be implemented as the system-on-chip 208 of the example portable QSS system 200 in FIG. 2.

At 706, output optical signals are generated by operation of the vapor cell sensor. In some implementations, the output optical signals are generated based on interactions between the input optical signals, the vapor and electromagnetic radiation received at the vapor cell sensor. In some aspects of operation, RF radiation or other electromagnetic radiation are received by the vapor cell sensor, and the RF radiation passes through a window (e.g., formed of the dielectric material) of the vapor cell to interact with the vapor residing in the vapor cell sensor. During such interaction, the input optical signals from the portable control package can be communicated to the vapor cell sensor. The input optical signals pass through the atoms in the vapor state, which undergo a change in optical transmission due to the presence of the electromagnetic radiation; and the output optical signals are generated. The input optical signal may experience a frequency-dependent absorption (or transmission) due to the presence of the electromagnetic radiation.

At 708, one or more properties of the electromagnetic radiation are determined. In some implementations, the output optical signals are received by one or more optical detectors which can convert the output optical signals to analog electrical signals. The analog electrical signals can be converted to digital signals by operation of the system-on-chip. The digital signals may be preprocessed locally. For example, the digitized output optical signals can be transformed, e.g., a wavelet transformation, a Fourier transformation, or another type of transformation. The transformed data can be further used locally, by operation of the portable control package of the portable QSS system to determine one or more properties of the electromagnetic radiation. The digitized output optical signals, the determined one or more properties, and other data can be stored in a memory unit of the system-on-chip of the portable control package along with timing data and geolocation data associated with the data. In some instances, the timing data can be obtained from a clock; and the geolocation data can be obtained from a location detection system. In some instances, data including the digitized output optical signals, the timing data, and the geolocation data may be communicated to a central computer system of a spectrum sensing network for processing, e.g., the central computer system 804 of the QSS network 800 shown in FIG. 8 or in another manner. In some implementations, the data transferred from the QSS system to the central computer system also includes the determined properties of the electromagnetic radiation.

In some instances, results from the example process 700 can be used to evaluate geographical coverage and spectrum usage, measure actual propagation ranges of communications links, or in other applications. For example, results can be used to perform occupancy analysis, e.g., detecting heavily occupied frequencies or rarely occupied frequencies; mitigate radio interference; trace the interference back to its source; deconflict the electromagnetic environment; and troubleshoot friendly transmissions that are disrupted—not intentionally jammed by adversaries. For another example, results from the example process 700 can be used to detect, identify and geolocate co-channel emissions and likewise sporadically active interference; optimize RF systems, e.g., optimizing radar arrays by minimizing side lobe emissions; and provide information about EMCON discipline compliances, e.g., by detecting and locating emission within a defined area. In some instances, the example process 700 may be used in other applications.

Figure 8:
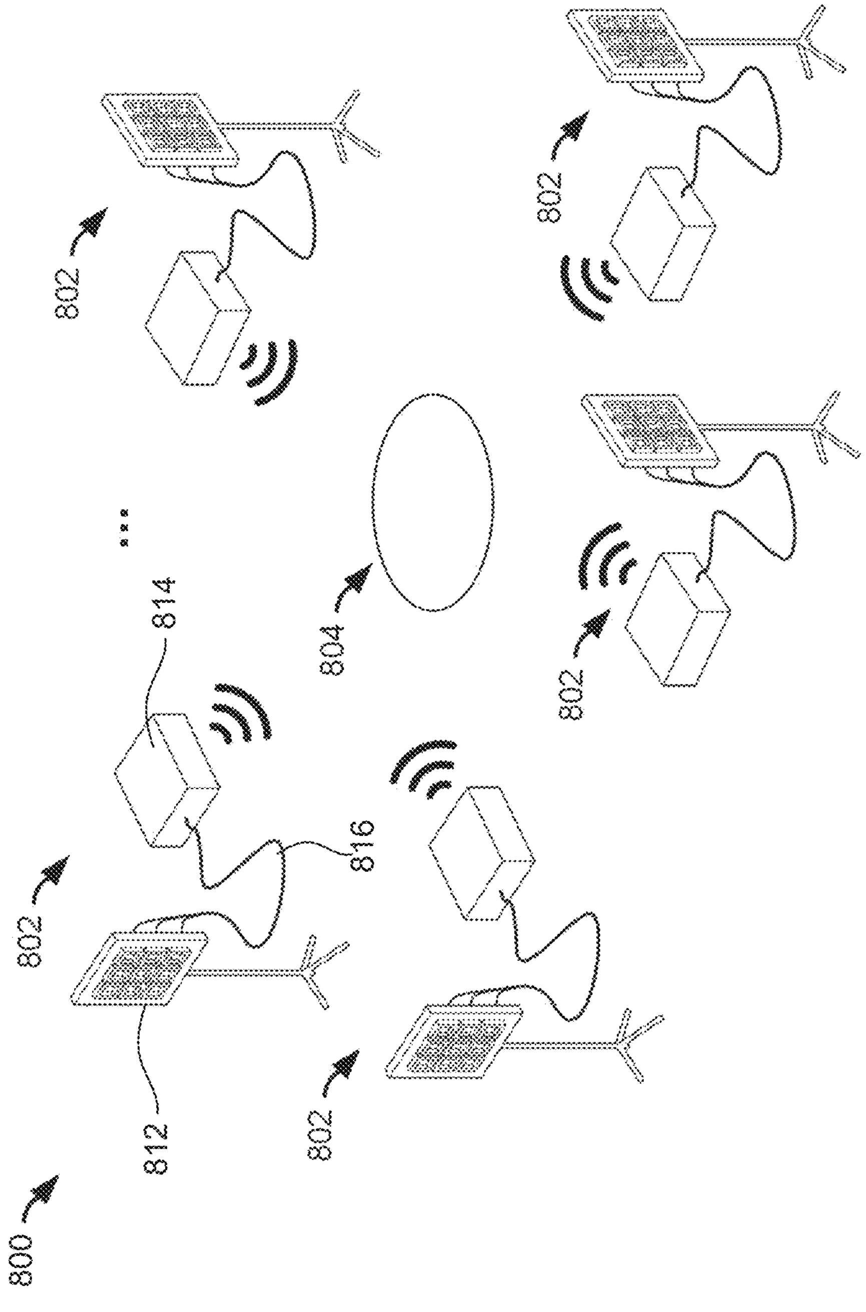
FIG. 8 is a schematic diagram showing an example QSS network.

FIG. 8 is a schematic diagram showing aspects of an example spectrum sensing network 800. As shown in FIG. 8, the example spectrum sensing network 800 includes multiple portable QSS systems 802 communicably connected to a computer system 804. The multiple portable QSS systems 802 are spatially distributed over a geographic region. In some implementations, the geographic region is larger than 1 square meter, 100 square meter, or in another range. In some instances, one or more portable QSS systems 802 may be wirelessly or wired connected to the computer system 804 for communicating data. In some instances, each portable QSS system 802 includes one or more vapor cell sensors 812 and a portable control package 814 communicably connected to the one or more vapor cell sensors 812 via a transmission link 816. In some instances, the transmission link 816 includes one or more optical fibers. In some instances, each portable QSS system 802 may be implemented as the portable QSS system 100, 200, 400, 500, 600, 620 or in another manner. In some instances, each portable QSS system 802 may be operated according to the operations in the example process 700 or in another manner. In certain examples, each portable QSS system 802 may include an array of vapor cell sensors 812. The arrays of vapor cell sensors 812 at different portable QSS systems 802 may have different topologies or configurations (e.g., frequencies, directions, etc.). In some implementations, the computer system 804 may communicate with other computer systems of other distinct networks. In some instances, the computer system 804 may be a central data fusion center with processors and memory units. In some examples, the computer system 804 may be a portable QSS system 802 within the network 800.

During operation, the portable QSS systems 802 can be fixed at respective measurement locations or may change locations during or between measurements. Geolocation data and timing data associated with the measurement data (e.g., the digitized output optical signals) when a spectrum sensing is performed, can be recorded by the respective portable QSS systems 802. Data including the measurement data, timing data, geolocation data, and other data can be communicated from respective portable QSS systems 802 to the computer system 804 for processing. In some implementations, the computer system 804 can be configured to receive, process and fuse the data received from the portable QSS systems 802 within the network 800.

Figure 9:
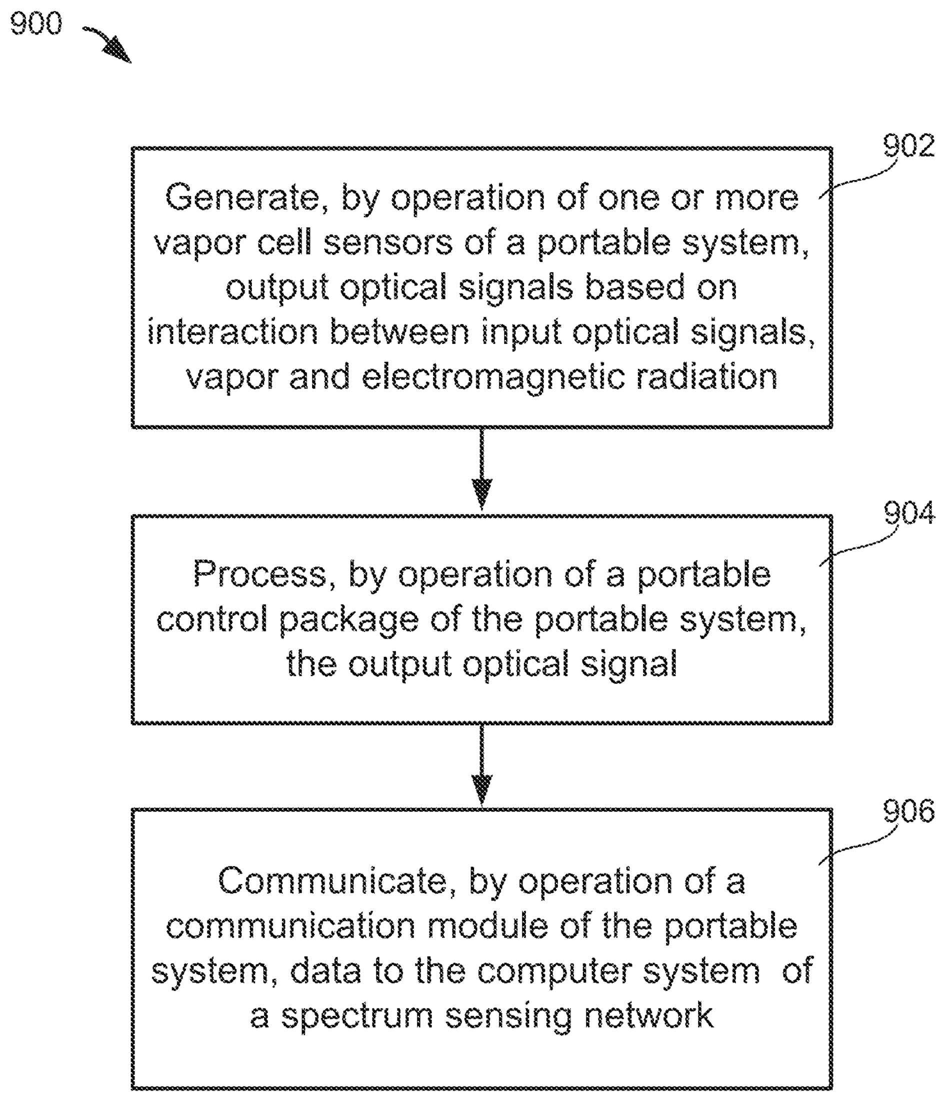
FIG. 9 is a flow chart showing aspects of an example process.

FIG. 9 is a flow chart showing aspects of an example process 900. In some instances, the example process 900 can be operated to characterize electromagnetic radiation in the field generated in a wireless communication network, in an electronic warfare environment, or in another application. The example process 900 may be performed by operations of a QSS network that includes multiple portable QSS systems. Each portable QSS system includes a portable control package and one or more vapor cell sensors each containing a vapor. The portable control package includes a laser system, a photonic integrated circuit system, and a system-on-chip. The QSS network may be implemented as the QSS network 800 in FIG. 8; and the portable QSS system may be implemented as the portable QSS system 100, 200, 400, 500, 600, 620 shown in FIGS. 1-2, 4-6B.

At 902, output optical signals are generated by operation of one or more vapor cell sensors of a portable QSS system. The output optical signals are generated based on interaction between input optical signals, the vapor in the vapor cell sensors, and electromagnetic radiation. In some instances, the input optical signals are generated by operation of a portable control package of the portable QSS system. In some instances, generating of the output optical signals may be performed by perform operations 702, 704, 706 in the example process 700 shown in FIG. 7 or in another manner.

At 904, the output optical signals are processed by operation of the portable control package. In some implementations, the output optical signals are received by one or more optical detectors which can convert the output optical signals to analog electrical signals. The analog electrical signals can be converted to digital signals by operation of the system-on-chip. The digital signals may be preprocessed locally. For example, the digitized output optical signals can be transformed, e.g., a wavelet transformation, a Fourier transformation, or another type of transformation. The transformed data can be further used locally, by operation of the portable control package of the portable QSS system to determine one or more properties of the electromagnetic radiation.

At 906, data is communicated by operation of a communication module of the portable QSS system to the computer system of the QSS network. In some instances, data including the digitized output optical signals, the timing data, and the geolocation data may be communicated to a central computer system of a spectrum sensing network for processing, e.g., the central computer system 804 of the QSS network 800 shown in FIG. 8 or in another manner. In some implementations, the data transferred from the QSS system to the central computer system also includes the determined properties of the electromagnetic radiation.

In some implementations, respective geolocation data and respective processed output optical signals are received by the computer system from the respective portable QSS systems via respective communication modules in the portable control packages; and the respective geolocation data and the respective digitized output optical signals are processed by the computer system to determine macro-diversity of the electromagnetic radiation in the field at different geolocations covered by the spectrum sensing network. In some implementations, the computer system can be configured to perform a spatial spectrum mapping based on the respective geolocation data and the respective processed output optical signals associated with the respective portable QSS systems. In some instances, a spatial spectrum mapping can be used to analyze and visualize how frequency spectrum is utilized over a given spatial area where the portable QSS systems are deployed. The output of the spectrum spatial mapping process can be used for applications like cognitive radio, spectrum management, interference detection, and resource allocation. By mapping the spectrum usage across different locations, it helps identify underutilized or vacant frequency bands, identify patterns of spectrum congestion or interference. For example, during a spectrum spatial mapping process, spectrum usage at different locations can be measured by operation of the portable QSS systems at respective locations. Each portable QSS system may include multiple vapor cell sensors configured to monitor signal strength and activity in different frequency bands. Geographical data such as the position of each vapor cell or each portable QSS system at the measurement point can be obtained locally by the location detection system to correlate frequency usage data with specific locations and with timing data which contains time of measurement. Once data is collected by the computer system from the portable QSS systems, interpolation techniques and visualization techniques can be performed to analyze and display data. In some instances, the spatial spectrum mapping can be performed in another manner.

In some implementations, the computer system is configured to generate results based on processing data from respective portable QSS systems; and perform decluttering based on the generated results. Various algorithms can be used to identify the source of the signals so that these signals can be identified and removed from the data. For example, signals can be identified based on the directions and amplitudes of the signals. For another example, signals that are not changing or moving can be identified and removed from the data. In some instances, other criteria can be used.

In some instances, the QSS network may introduce network redundancy for example, by introducing overlapping detection areas from different portable QSS systems and minimizing data losses caused by failed nodes in the distributed wireless spectrum sensing network. In some instances, failed operation or communication of one or more portable QSS systems do not affect the overall operation of the network. The computer system may include communication modules that enable hybrid wireless connectivity (e.g., LoRaWAN, WiFi and backhaul, satellite backhaul, etc.) or optical connectivity (e.g. optical fiber, free-space optical communications, etc.) with the multiple portable QSS systems. In some instances, for fail-over redundancy at least two or more of the portable QSS systems may include backhaul connectivity in the field (such as satellites).

In some instances, the computer system can send information and instruction data back to the portable QSS systems within the network to provide information reflective of a respective portable QSS system, the entire QSS network, or a subset of the QSS network. The information and instruction data can be communicated in part or in whole from the computer system to the portable QSS systems of the network. In some instances, the information and instruction data may be also communicated from the computer system to one or more portable QSS systems. In some implementations, instruction data may include updates or changes to settings or parameters of the one or more portable QSS systems. For example, after processing the data from a portable QSS system residing at a geolocation, the computer system may determine properties of the electromagnetic radiation detected by the portable QSS system; and may further generate instruction data that can be used to reconfigure the measurement settings of the portable QSS system. For example, the computer system may identify a narrower or different RF frequency ranges of interest for the portable QSS system to measure; a different orientation direction or a different measurement location for the portable QSS system to measure; and perform topographical corrections. For example, areas that are obscured by topographical features to be identified, and compensated or corrected for. In certain examples, the computer system may instruct the portable QSS system to perform reconfigurations of other settings.

Some of the subject matter and operations described in this specification can be implemented in digital electronic circuitry, or in computer software, firmware, or hardware, including the structures disclosed in this specification and their structural equivalents, or in combinations of one or more of them. Some of the subject matter described in this specification can be implemented as one or more computer programs, i.e., one or more modules of computer program instructions, encoded on a computer storage medium for execution by, or to control the operation of, data-processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media.

Some of the operations described in this specification can be implemented as operations performed by a data processing apparatus on data stored on one or more computer-readable storage devices or received from other sources.

The term "data-processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them.

A computer program (also known as a program, software, software application, script, or code) can be written in any form of programming language, including compiled or interpreted languages, declarative or procedural languages, and it can be deployed in any form, including as a standalone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

In a general aspect, a quantum spectrum sensing (QSS) network is described.

In a first example, a portable system for detecting electromagnetic radiation in an environment includes a vapor cell sensor and a portable control package. The vapor cell sensor includes a vapor and is configured to generate output optical signals based on interactions between input optical signals, the vapor and the electromagnetic radiation. The portable control package includes a laser system configured to generate laser signals; a photonic integrated circuit system configured to generate the input optical signals based on the laser signals from the laser system; and a system-on-chip configured to communicate control signals to the laser system and the photonic integrated circuit system; and process the output optical signals to determine one or more properties of the electromagnetic radiation.

Implementations of the first example may include one or more of the following features. The laser system includes a semiconductor laser. The laser system includes a fiber laser. The laser system includes a first laser configured to generate a first laser signal, and a second laser configured to generate a second laser signal. The photonic integrated circuit system includes a first comb generator configured to generate a first frequency comb signal based on the first laser signal; and a second comb generator configured to generate a second frequency comb signal based on the second laser signal, and the input optical signals are based on the first frequency comb signal and the second frequency comb signal.

Implementations of the first example may include one or more of the following features. The first comb generator includes a first electro-optic modulator, and the second comb generator includes a second electro-optic modulator. The photonic integrated circuit system includes a third electro-optic modulator configured to receive the second frequency comb signal and apply a frequency shift to one or more frequency components of the second frequency comb signal. The input optical signals are based on the first frequency comb signal and the one or more frequency components having the frequency shift.

Implementations of the first example may include one or more of the following features. The photonic integrated circuit system includes one or more amplifiers configured to amplify the second laser signal, and the second comb generator is configured to generate the second frequency comb signal based on the amplified second laser signal. The photonic integrated circuit system includes one or more amplifiers configured to amplify the first laser signal, and the first frequency comb signal is generated based on the amplified first laser signal. The photonic integrated circuit system includes an electro-optic switching network configured to select one or more frequency components in the second frequency comb signal. The system further includes multiple vapor cell sensors arranged in an array and configured to receive respective frequency components of the second frequency comb signal.

Implementations of the first example may include one or more of the following features. The electromagnetic radiation includes wireless signals transmitted in a wireless communication network, and the system-on-chip is configured to process the output optical signals to determine one or more properties of the wireless signals. The vapor cell sensor is configured to receive wireless signals in an electronic warfare environment, and the system-on-chip is configured to process the output optical signals to determine one or more properties of the wireless signals.

Implementations of the first example may include one or more of the following features. The system-on-chip comprises a Field Programmable Gate Array (FPGA). The portable control package includes a battery unit configured to provide power to the laser system. The system-on-chip includes a radio frequency (RF) integrated circuit. The portable control package is communicably connected to the vapor cell sensor through one or more optical fibers. The system includes multiple vapor cell sensors configured in an array and oriented in different directions. The portable control package includes a communication module configured to communicate with one or more other portable systems.

Implementations of the first example may include one or more of the following features. The portable control system includes a housing that houses the semiconductor laser system, the photonic integrated circuit system, and the system-on-chip. The vapor cell sensor resides outside the housing. The portable control system is configured to be carried in a backpack. The system includes multiple vapor cell sensors arranged in an array, and one or more optical channels that connect the array with the portable control system. The system includes a support structure that supports the vapor cell sensors at their respective locations in the array. The portable control package includes a clock configured to provide timing data associated with the one or more properties of the electromagnetic radiation; and a location detection system configured to provide geolocation data associated with the one or more properties of the electromagnetic radiation.

In a second example, a method includes receiving, at a laser system, control signals from a system-on-chip; generating, by operation of the laser system, laser signals; receiving, at a photonic integrated circuit system, control signals from the system-on-chip; generating, by operation of the photonic integrated circuit system, input optical signals based on the laser signals from the laser system; generating, by operation of a vapor cell sensor including a vapor, output optical signals based on interactions between the input optical signals, the vapor and electromagnetic radiation; and processing, by operation of the system-on-chip, the output optical signals to determine one or more properties of the electromagnetic radiation.

Implementations of the second example may include one or more of the following features. Generating the laser signals includes generating a first laser signal by operation of a first laser of the laser system; generating, by operation of a first comb generator of the photonic integrated circuit system, a first frequency comb signal based on the first laser signal; generating a second laser signal by operation of a second laser of the laser system; and generating, by operation of a second comb generator of the photonic integrated circuit system, a second frequency comb signal based on the second laser signal, wherein the input optical signals are based on the first frequency comb signal and the second frequency comb signal.

Implementations of the second example may include one or more of the following features. The method includes applying, by operation of an electro-optic modulator, a frequency shift to one or more frequency components of the second frequency comb signal, wherein the input optical signals are based on the first frequency comb signal and the one or more frequency components having the frequency shift. The method further includes amplifying, by operation of one or more amplifiers, the first laser signal. Generating the first comb generator based on the first laser signal includes generating the first frequency comb signal based on the amplified first laser signal. The method includes amplifying, by operation of one or more amplifiers, the second laser signal. Generating the second comb generator based on the second laser signal includes generating the second frequency comb signal based on the amplified second laser signal.

Implementations of the second example may include one or more of the following features. The method includes selecting, by operation of an electro-optic switching network, one or more frequency components in the second frequency comb signal. The electromagnetic radiation includes wireless signals transmitted in a wireless communication network, and processing the output optical signals comprises processing the output optical signals to determine one or more properties of the wireless signals. The vapor cell sensor is configured to receive wireless signals in an electronic warfare environment, and processing the output optical signals comprises processing the output optical signals to determine one or more properties of the wireless signals.

In a third example, a spectrum sensing network includes a computer system; and a plurality of portable systems spatially distributed over a geographic region. Each of the plurality of portable systems includes one or more vapor cell sensors each including a vapor and being configured to generate output optical signals based on interactions between input optical signals, the vapor and electromagnetic radiation; a portable control package including one or more processors configured to process the output optical signals; and a communication module configured to communicate, to the computer system, data based on the processed output optical signals.

Implementations of the third example may include one or more of the following features. The data includes the processed output optical signals. The communication module is an RF wireless communication module. The communication module is an optical communication module. The computer system is a central data processing system, and the computer system is configured to receive the data from the plurality of portable systems; and determine one or more properties of electromagnetic radiation associated with the plurality of portable systems.

Implementations of the third example may include one or more of the following features. The computer system is further configured to generate reconfiguration information for one or more portable systems according to the one or more properties of the respective electromagnetic radiation; and communicate the reconfiguration information to the one or more portable systems, the reconfiguration information being used by the one or more portable systems to update settings of respective portable control packages of the one or more portable systems. The one or more processors of the portable control package is configured to determine one or more properties of the electromagnetic radiation based on the output optical signals. The data includes the one or more properties.

Implementations of the third example may include one or more of the following features. The portable control package includes a laser system configured to generate laser signals; a photonic integrated circuit system configured to generate the input optical signals based on the laser signals from the laser system; and a system-on-chip including the one or more processors configured to communicate control signals to the laser system and the photonic integrated circuit system; and process the output optical signals to determine the one or more properties of the electromagnetic radiation. Each portable systems includes a positioning system configured to generate geolocation data associated with the portable system, the data communicated to the computer system further comprises the geolocation data, and the computer system is configured to receive and process the data from the plurality of portable systems.

Implementations of the third example may include one or more of the following features. The computer system is configured to perform spatial spectrum mapping based on the data from the plurality of portable systems. The computer system is configured to perform decluttering based on the data from the plurality of portable systems. A plurality of portable systems are spatially distributed over a geographic region larger than 1 square meter. A plurality of portable systems are spatially distributed over a geographic region larger than 100 square meters.

In a fourth example, a spectrum sensing network includes a plurality of portable systems spatially distributed over a geographic region and a computer system. The method for operating the spectrum sensing network includes generating, by operation of one or more vapor cell sensor of a portable system each comprising a vapor, output optical signals based on interaction between input optical signals, the vapor and electromagnetic radiation; processing, by operation of a portable control package of the portable system, the output optical signal; communicating, by operation of a communication module of the portable system, data to the computer system, the data based on the processed output optical signals.

Implementations of the fourth example may include one or more of the following features. The method includes generating, by operation of a laser system of the portable control package, laser signals; generating, by operation of a photonic integrated circuit system, the input optical signals based on the laser signals from the laser system; and processing, by operation of a system-on-chip, the output optical signals to determine one or more properties of the electromagnetic radiation. Determining, by operation of the computer system of the spectrum sensing network, one or more properties of electromagnetic radiation received by the plurality of portable systems.

Implementations of the fourth example may include one or more of the following features. The method includes generating, by operation of the computer system, reconfiguration information for one or more portable systems based on the one or more properties of the electromagnetic radiation; communicating the reconfiguration information to the one or more portable systems; and reconfiguring, by operation of respective portable control packages of the one or more portable systems, by updating settings of the respective portable control packages of the one or more portable systems based on the reconfiguration information.

Implementations of the fourth example may include one or more of the following features. Determining, by operation of the portable control package of a portable system, one or more properties of electromagnetic radiation received by the portable system, and the data includes the one or more determined properties of the electromagnetic radiation.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple implementations separately or in any suitable sub-combination. The method includes generating, by operation of a positioning system of the portable system, geolocation data associated with the portable system. The data communicated to the computer system further includes the geolocation data, and the method further includes receiving and processing, by operation the computer system, the data from the portable system. The method includes performing, by operation of the computer system, spatial spectrum mapping based on the data from the plurality of portable systems. The method includes performing, by operation of the computer system, decluttering based on the data from the plurality of portable systems.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A spectrum sensing network comprising:
- a computer system; and
- a plurality of portable systems spatially distributed over a geographic region, each of the plurality of portable systems comprising:
  - one or more vapor cell sensors each comprising a vapor and being configured to generate output optical signals based on interactions between input optical signals, the vapor and electromagnetic radiation;
  - a portable control package comprising one or more processors configured to process the output optical signals; and
  - a communication module configured to communicate, to the computer system, data based on the processed output optical signals.

2. The network of claim 1, wherein the data comprises the processed output optical signals.

3. The network of claim 1, wherein the communication module is an RF wireless communication module.

4. The network of claim 1, wherein the communication module is an optical communication module.

5. The network of claim 1, wherein the computer system is a central data processing system, and the computer system is configured to:
- receive the data from the plurality of portable systems; and
- determine one or more properties of electromagnetic radiation associated with the plurality of portable systems.

6. The network of claim 5, wherein the computer system is further configured to:
- generate reconfiguration information for one or more portable systems according to the one or more properties of the respective electromagnetic radiation; and
- communicate the reconfiguration information to the one or more portable systems, the reconfiguration information being used by the one or more portable systems to update settings of respective portable control packages of the one or more portable systems.

7. The network of claim 5, wherein the one or more processors of the portable control package are configured to:
- determine one or more properties of the electromagnetic radiation based on the output optical signals.

8. The network of claim 7, wherein the data comprises the one or more properties.

9. The network of claim 1, wherein the portable control package comprises:
- a laser system configured to generate laser signals;
- a photonic integrated circuit system configured to generate the input optical signals based on the laser signals from the laser system; and
- a system-on-chip comprising the one or more processors configured to:
  - communicate control signals to the laser system and the photonic integrated circuit system; and
  - process the output optical signals to determine one or more properties of the electromagnetic radiation.

10. The network of claim 1, wherein each portable system comprises a positioning system configured to generate geolocation data associated with the portable system, the data communicated to the computer system further comprises the geolocation data, and the computer system is configured to receive and process the data from the plurality of portable systems.

11. The network of claim 10, wherein the computer system is configured to perform spatial spectrum mapping based on the data from the plurality of portable systems.

12. The network of claim 10, wherein the computer system is configured to perform decluttering based on the data from the plurality of portable systems.

13. The network of claim 1, wherein the plurality of portable systems are spatially distributed over a geographic region larger than 1 square meter.

14. The network of claim 1, wherein the plurality of portable systems are spatially distributed over a geographic region larger than 100 square meters.

15. A method of operating a spectrum sensing network, the spectrum sensing network comprising a plurality of portable systems spatially distributed over a geographic region and a computer system, the method comprising:
- at each of the plurality of portable systems:
  - by operation of one or more vapor cell sensors each comprising a vapor, generating output optical signals based on interactions between input optical signals, the vapor and electromagnetic radiation;
  - by operation of one or more processors in a portable control package, processing the output optical signals; and by operation of a communication module in the portable control package, communicating data to the computer system based on the processed output optical signals; and at the computer system, receiving the data from the plurality of portable systems.

16. The method of claim 15, comprising, at each of the plurality of portable systems:

generating, by operation of a laser system in the portable control package, laser signals;

generating, by operation of a photonic integrated circuit system in the portable control package, the input optical signals based on the laser signals from the laser system; and processing, by operation of a system-on-chip in the portable control package, the output optical signals to determine one or more properties of the electromagnetic radiation.

17. The method of claim 15, comprising:

determining, by operation of the computer system of the spectrum sensing network, one or more properties of electromagnetic radiation received by the plurality of portable systems.

18. The method of claim 17, comprising:

generating, by operation of the computer system, reconfiguration information for one or more portable systems based on the one or more properties of the electromagnetic radiation;

communicating the reconfiguration information to the one or more portable systems; and reconfiguring, by operation of respective portable control packages of the one or more portable systems, by updating settings of the respective portable control packages of the one or more portable systems based on the reconfiguration information.

19. The method of claim 15, comprising:

determining, by operation of the portable control package of a portable system, one or more properties of electromagnetic radiation received by the portable system, wherein the data comprises the one or more determined properties of the electromagnetic radiation.

20. The method of claim 15, comprising:

generating, by operation of a positioning system of the portable system, geolocation data associated with the portable system, wherein the data communicated to the computer system further comprises the geolocation data, and receiving and processing, by operation of the computer system, the data from the portable system.

21. The method of claim 15, comprising:

performing, by operation of the computer system, spatial spectrum mapping based on the data from the plurality of portable systems.

22. The method of claim 15, comprising:

performing, by operation of the computer system, decluttering based on the data from the plurality of portable systems.

* * * * *